(12) United States Patent
Gray et al.

(10) Patent No.: US 10,823,365 B2
(45) Date of Patent: Nov. 3, 2020

(54) OPTICAL APPARATUS FOR WIDE-ANGLE ILLUMINATION

(71) Applicant: Finisar Corporation, Sunnyvale, CA (US)

(72) Inventors: Timothy S. Gray, Richardson, TX (US); Christoph M. Greiner, Eugene, OR (US); Justin M. Hannigan, Eugene, OR (US); Dmitri Iazikov, Eugene, OR (US); Charles B. Roxlo, Saratoga, CA (US); Jianji Yang, Eugene, OR (US)

(73) Assignee: II-VI Delaware Inc., Wilmington, DE (US)

(*) Notice: Subject to any disclaimer, the term of this patent is extended or adjusted under 35 U.S.C. 154(b) by 0 days.

(21) Appl. No.: 16/719,098

(22) Filed: Dec. 18, 2019

(65) Prior Publication Data

US 2020/0200357 A1 Jun. 25, 2020

Related U.S. Application Data

(60) Provisional application No. 62/894,780, filed on Aug. 31, 2019, provisional application No. 62/784,484, filed on Dec. 23, 2018.

(51) Int. Cl.
*F21V 3/00* (2015.01)
*G02B 5/02* (2006.01)
*F21V 5/00* (2018.01)
*F21Y 105/10* (2016.01)
*F21Y 115/30* (2016.01)

(52) U.S. Cl.
CPC ............... *F21V 3/00* (2013.01); *F21V 5/008* (2013.01); *G02B 5/02* (2013.01); *F21Y 2105/10* (2016.08); *F21Y 2115/30* (2016.08)

(58) Field of Classification Search
CPC . F21V 3/00; F21V 5/002; F21V 5/007; F21V 5/008; G02B 5/02; F21Y 2115/30; G03B 21/2033; G03B 2215/0567
See application file for complete search history.

(56) References Cited

U.S. PATENT DOCUMENTS

| | | | |
|---|---|---|---|
| 2018/0198254 A1 | 7/2018 | Tatum et al. | |
| 2018/0259836 A1* | 9/2018 | Fukui | G03B 21/2033 |
| 2020/0041847 A1* | 2/2020 | Kobayashi | B60K 35/00 |
| 2020/0192106 A1* | 6/2020 | Short | H01S 3/1611 |

OTHER PUBLICATIONS

Co-owned U.S. Appl. No. 16/525,574 entitled "Diffraction grating array for wide-angle illumination" filed Jul. 30, 2019 in the names of Mossberg et al.
Co-owned U.S. Appl. No. 16/558,033 entitled "Optical apparatus for wide-angle illumination" filed Aug. 30, 2019 in the names of Greiner et al.

* cited by examiner

*Primary Examiner* — Alan B Cariaso
(74) *Attorney, Agent, or Firm* — Maschoff Brennan

(57) ABSTRACT

Input optical signals propagate toward first optical diffuser, resulting in first-forward-directed optical signals that propagate toward a second optical diffuser, in turn resulting in second forward-directed optical signals. The second forward-directed optical signals collectively form the optical output of an illumination source that appears to emanate from an enlarged extended source and exhibits reduced speckle. The illumination source can include multiple laser sources formed on or attached to the first optical diffuser.

20 Claims, 14 Drawing Sheets

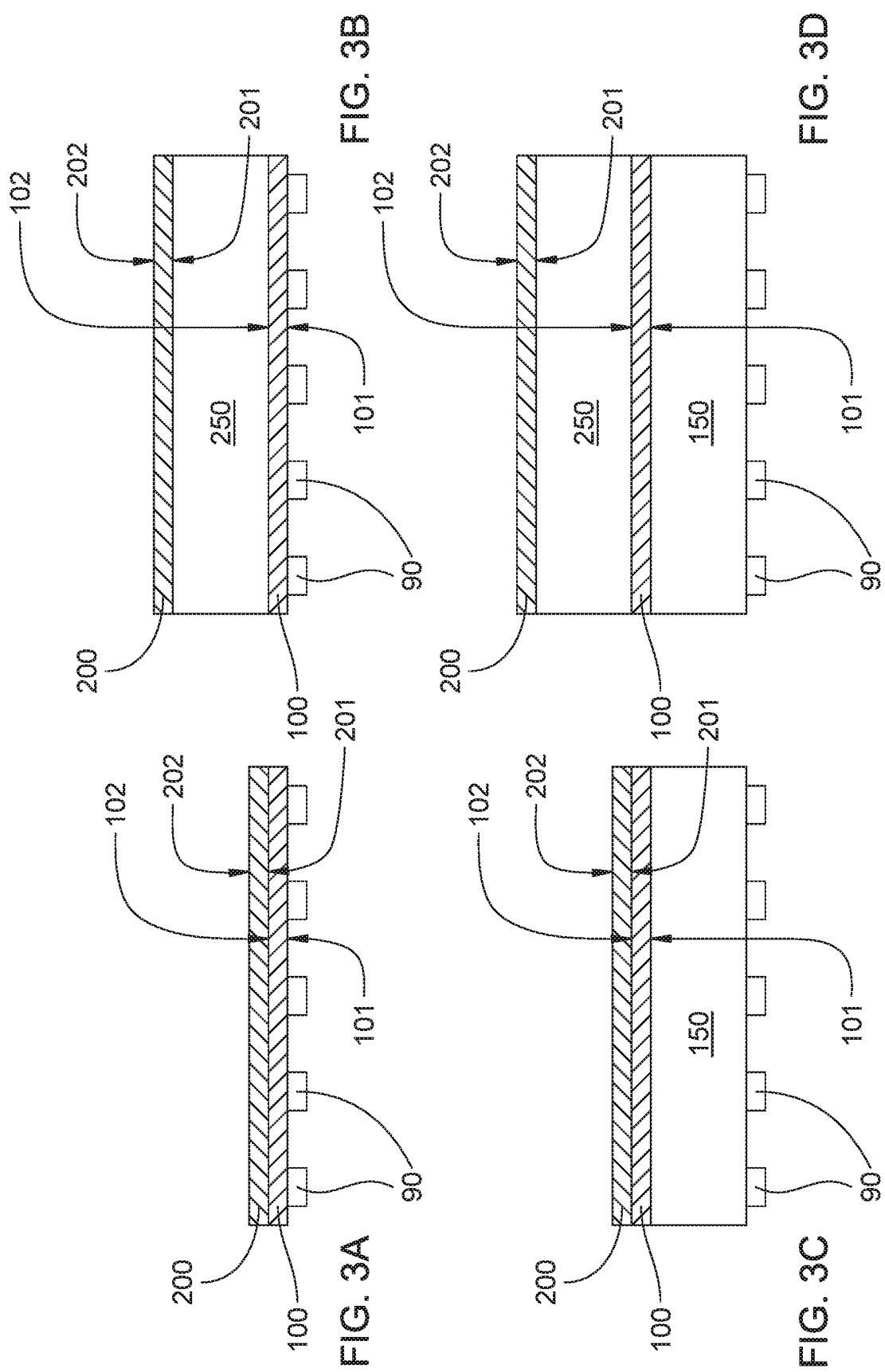

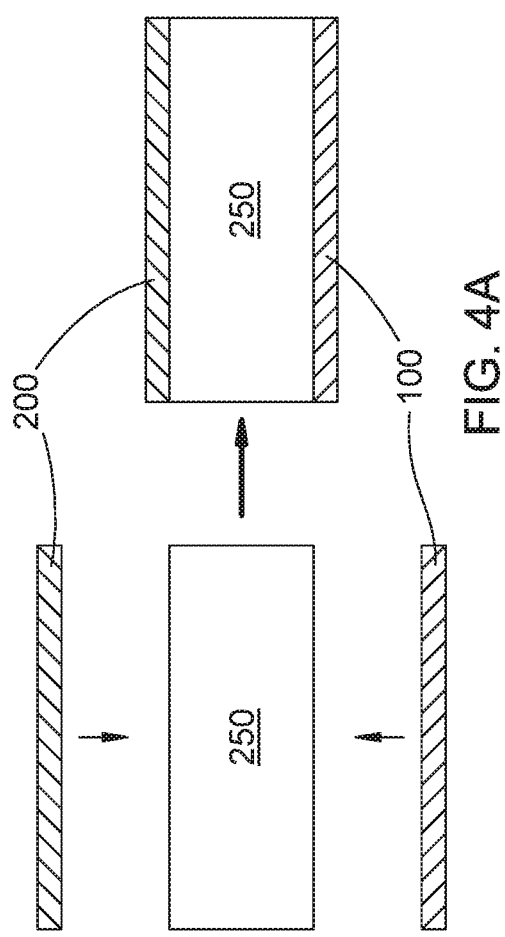
FIG. 4A
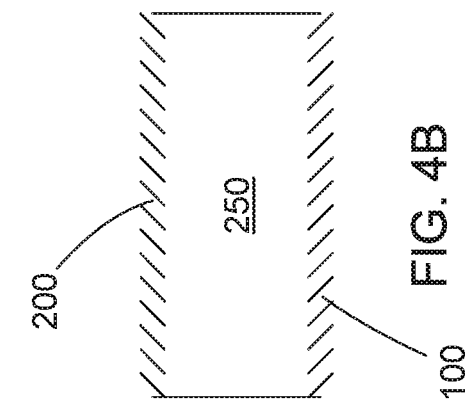
FIG. 4B
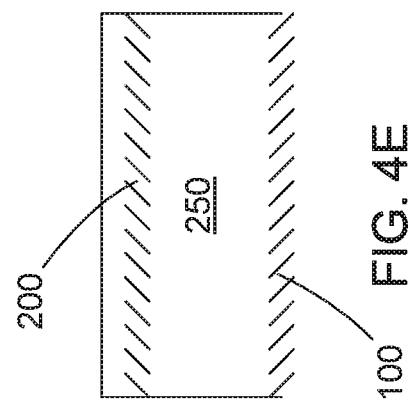
FIG. 4E
FIG. 4C
FIG. 4D
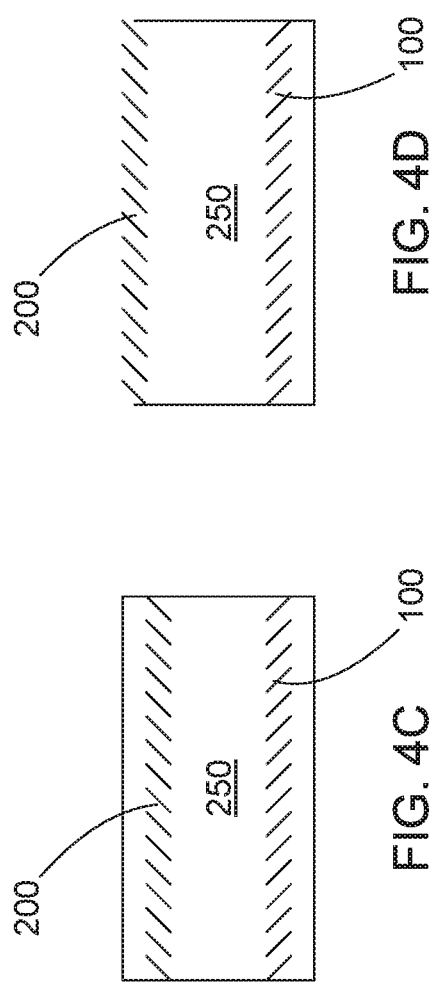

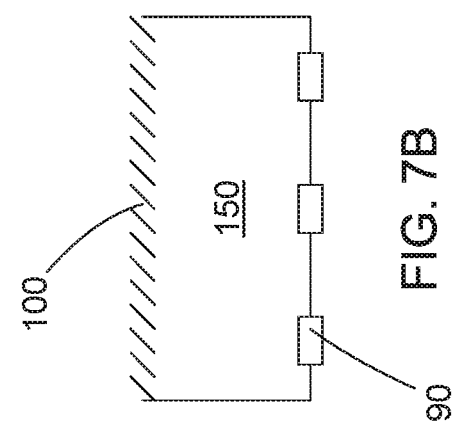
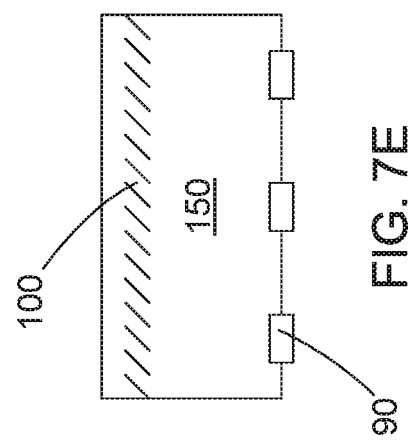
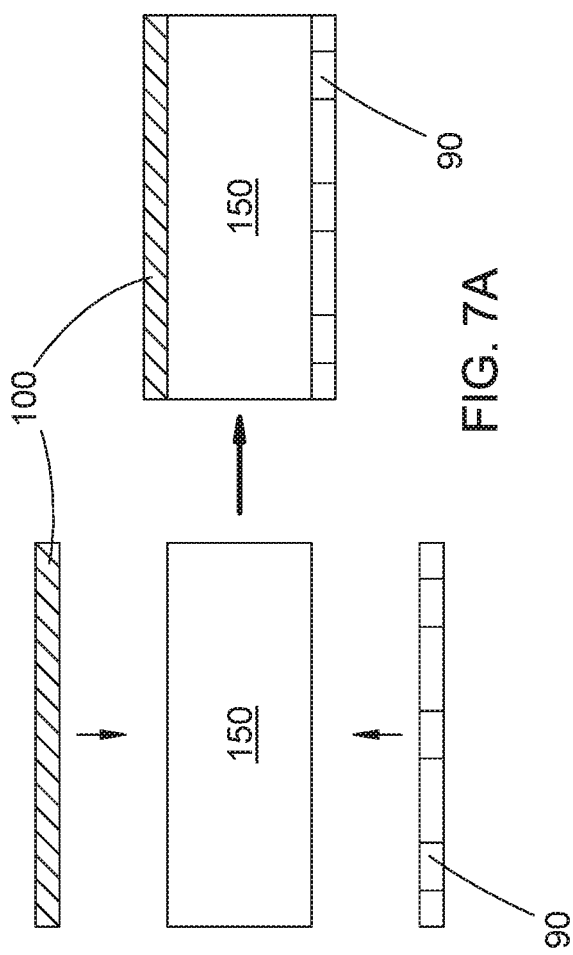
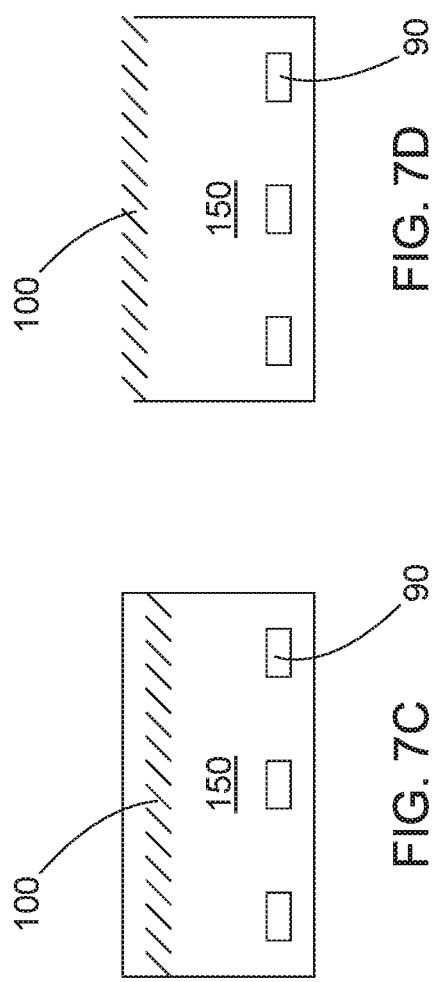

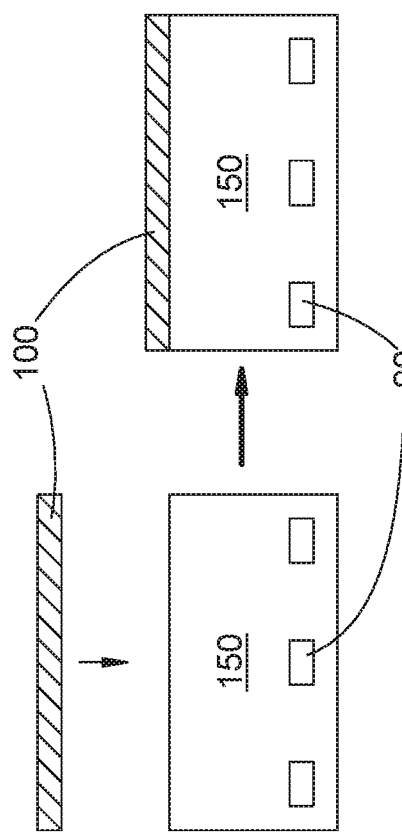
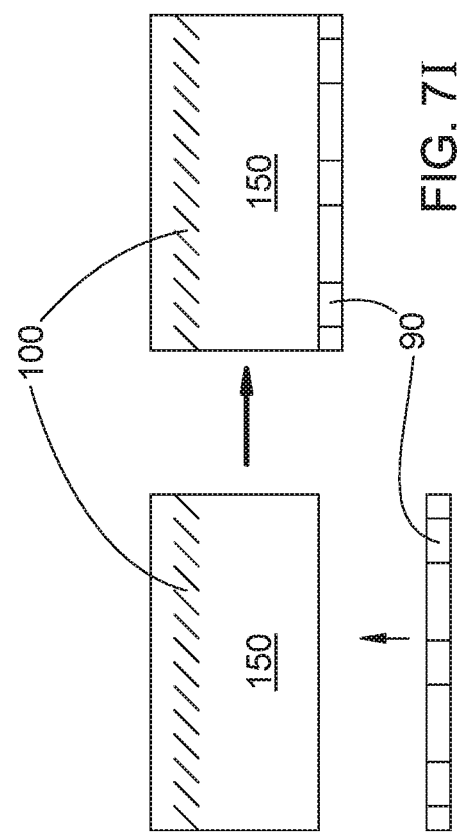
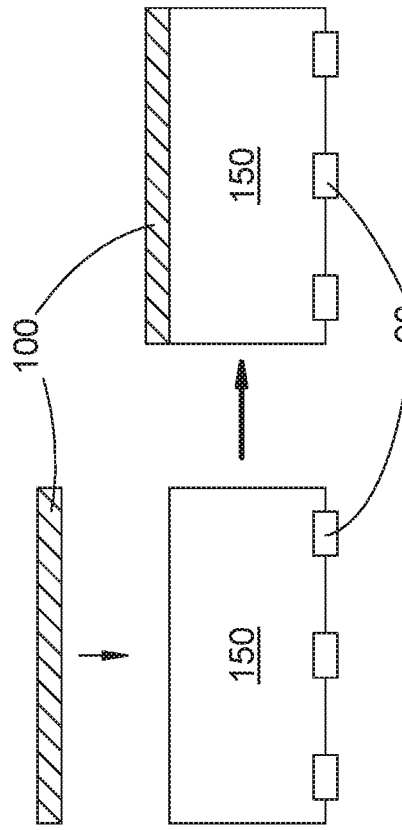
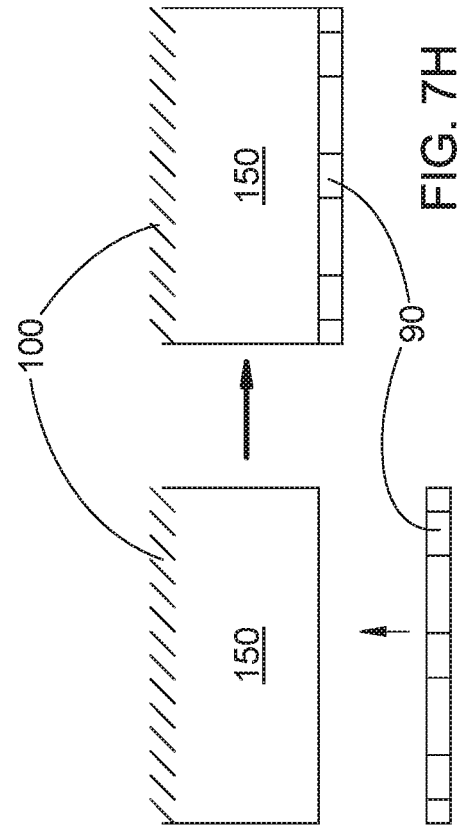

OPTICAL APPARATUS FOR WIDE-ANGLE ILLUMINATION

BENEFIT CLAIMS TO RELATED APPLICATIONS

This application claims benefit of (i) U.S. provisional App. No. 62/784,484 entitled "Diffraction grating array for wide-angle illumination" filed Dec. 23, 2018 in the names of Mossberg et al and (ii) U.S. provisional App. No. 62/894,780 entitled "Optical apparatus for wide-angle illumination" filed Aug. 31, 2019 in the names of Gray et al, each of said provisional applications being hereby incorporated by reference as if fully set forth herein.

FIELD OF THE INVENTION

The field of the present invention relates to wide-angle illumination. In particular, disclosed herein are at least two optical diffusers arranged in series that are positioned or arranged for providing wide-angle illumination.

SUMMARY

An inventive optical apparatus comprises a first optical diffuser and a second optical diffuser. Each of the optical diffusers has corresponding opposite input and output faces and is operational over a selected operational wavelength range. The input face of second optical diffuser faces the output face of the first optical diffuser, often with the first optical diffuser spaced apart from the second optical diffuser. One or more forward-propagating input optical signals, each having a corresponding input signal wavelength within the operational wavelength range, propagate toward and are incident on the input face of the first optical diffuser. At least a portion of each one of those input optical signals is redirected or transformed by the first optical diffuser into a corresponding first forward-directed optical signal that propagates between the first and second optical diffusers away from the output face of the first optical diffuser. In turn, at least a portion of each first forward-directed optical signal incident on the input face of the second optical diffuser is redirected or transformed by the second optical diffuser into a corresponding second forward-directed optical signal that propagates away from the output face of the second optical diffuser. As a result of those redirections or transformations, each first forward-directed optical signal differs from the corresponding input optical signal, and each second forward-directed optical signal differs from the corresponding first forward-directed optical signal, with respect to one or more or all of (i) a number of corresponding constituent optical beams, (ii) propagation direction of one or more of the corresponding constituent optical beams, or (iii) angular divergence of one or more of the corresponding constituent optical beams. The corresponding second forward-directed optical signals, arising from all first forward-directed optical signals incident on the input face of the second optical diffuser, collectively comprise optical output of the optical apparatus.

An inventive optical apparatus can in some instances include one or more additional optical diffusers arranged in series with the first and second optical diffusers. An inventive optical apparatus can further include one or more optical sources; each optical source is positioned and arranged so as to produce a corresponding input optical signal. The optical output can exhibit reduced noise due to optical speckle, can appear to emanate from a larger effective extended optical source, or can exhibit a larger or otherwise modified angular field-of-illumination (FOI), compared to a reference apparatus that is structured and arranged identically to the inventive apparatus except that the reference apparatus includes either only the first optical diffuser or only the second optical diffuser, but not both.

Objects and advantages pertaining to wide-angle illumination may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 3A illustrates schematically an inventive optical device with optical sources against the first optical diffuser and with the first optical diffuser against the second optical diffuser; FIG. 3B illustrates schematically an inventive optical device with optical sources against the first optical diffuser and with an intermediate optical medium between the first optical diffuser and the second optical diffuser; FIG. 3C illustrates schematically an inventive optical device with an input optical medium between the optical sources and the first optical diffuser and with the first optical diffuser against the second optical diffuser; FIG. 3D illustrates schematically an inventive optical device with an input optical medium between the optical sources and the first optical diffuser and with an intermediate optical medium between the first optical diffuser and the second optical diffuser.

FIGS. 4A through 4I illustrate schematically various combinations of first and second optical diffusers attached to a solid intermediate optical medium, formed as a surface relief structure on a solid intermediate optical medium, or formed within a solid intermediate optical medium.

FIGS. 7A through 7I illustrate schematically various combinations of optical sources and a first optical diffuser attached to a solid input optical medium, formed as a surface relief structure on a solid input optical medium, or formed within a solid input optical medium.

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, only a handful of laser sources, lenses, prisms, gratings, and so forth are shown various drawings, where dozens, hundreds, thousands, or more might be present in an actual inventive device. Optical signals are represented by simple rays, where actual signals would propagate as extended beams with corresponding spatial profiles. The height, depth, or width of various structures shown are often distorted to highlight some feature or arrangement. The embodiments shown are only examples and should not be construed as limiting the scope of the present disclosure or appended claims.

DETAILED DESCRIPTION OF EMBODIMENTS

Figure 1A:
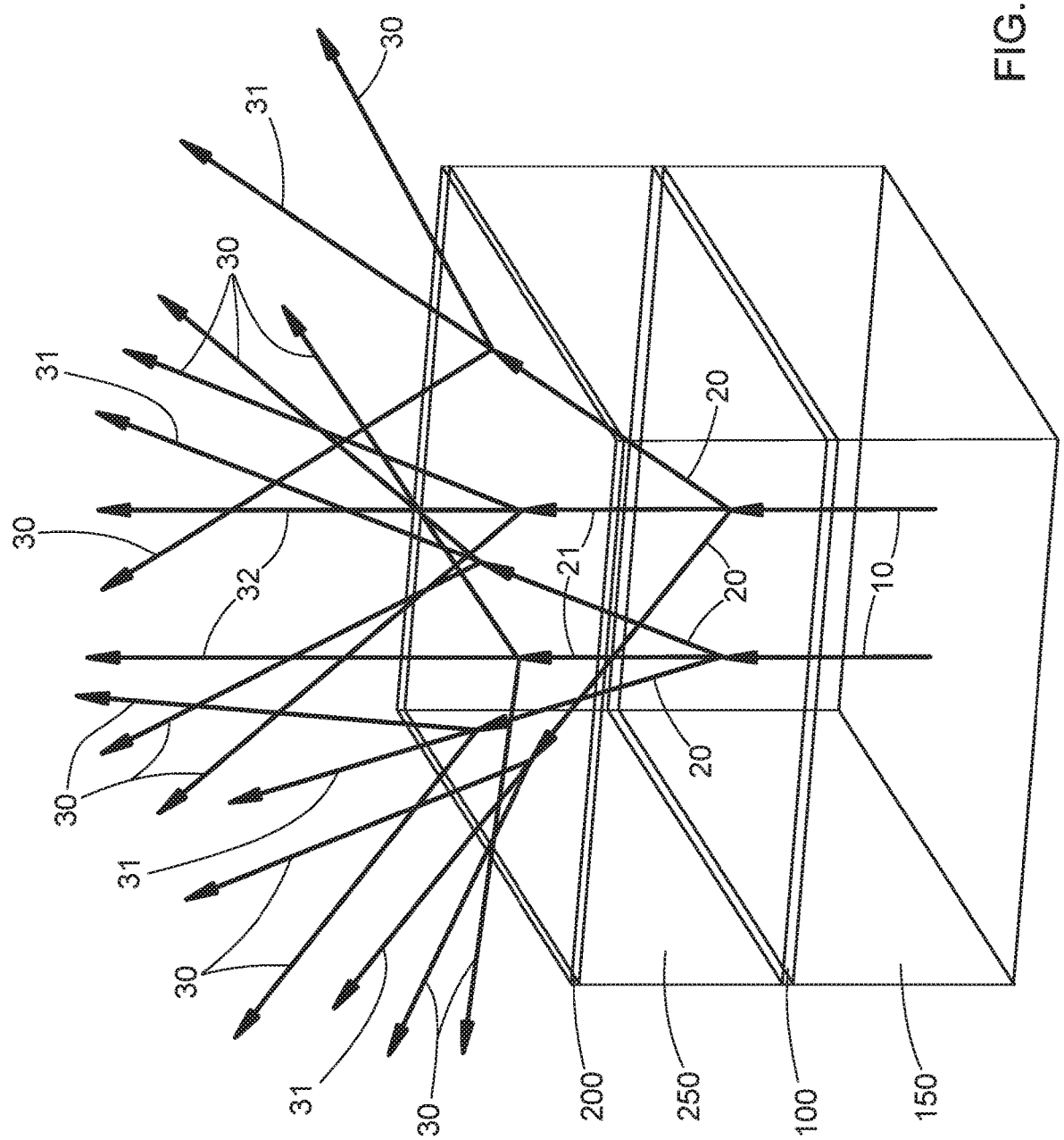
FIGS. 1A and 1B are schematic perspective and side views, respectively, of a general arrangement of an inventive optical device including first and second optical diffusers.
Figure 1B:
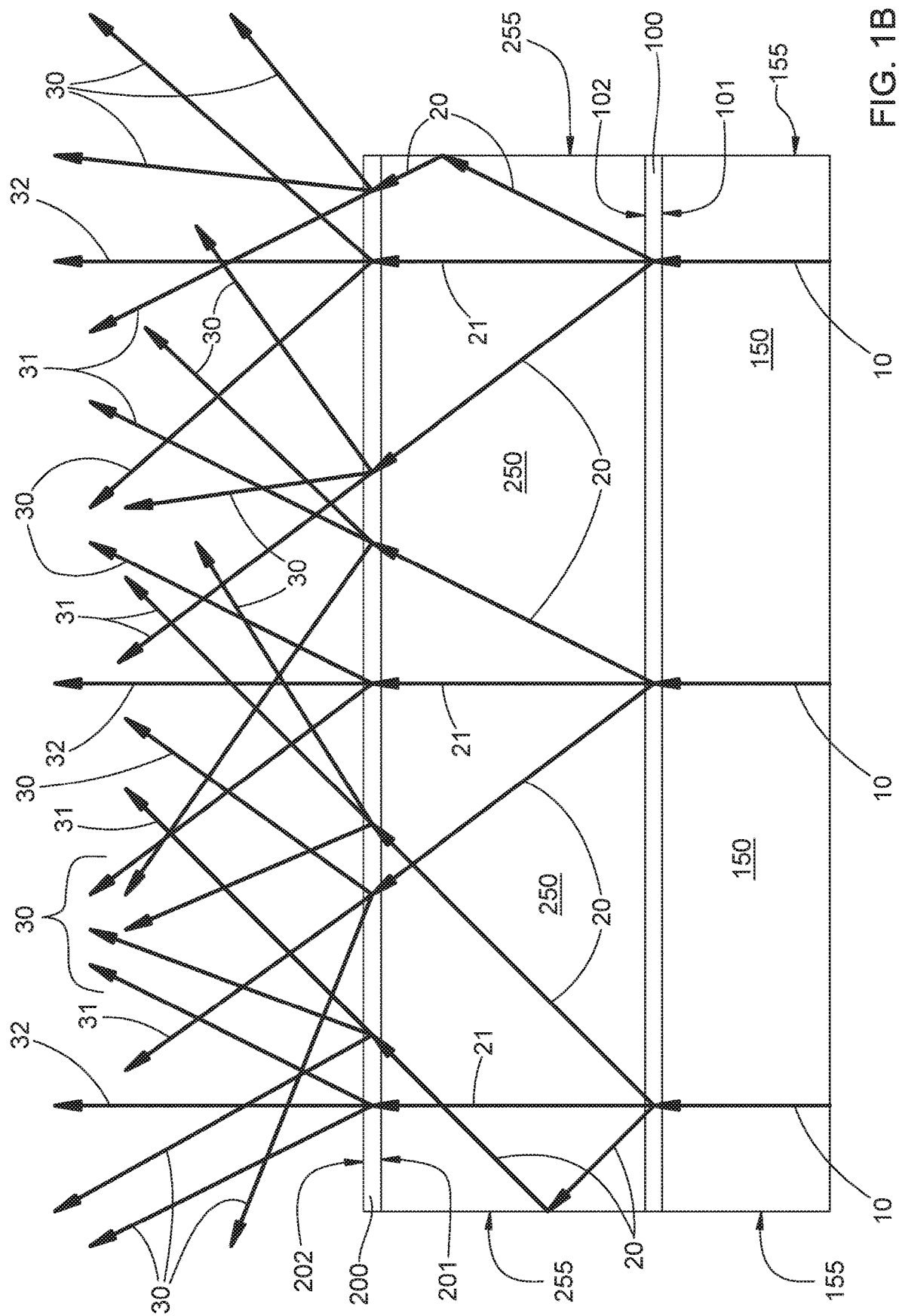

An inventive optical apparatus comprises a first optical diffuser 100 and a second optical diffuser 200. The first and second optical diffusers 100/200 are operational over a selected operational wavelength range. The first optical diffuser 100 has opposite input and output faces 101 and 102, respectively; the second optical diffuser 200 has opposite input and output faces 201 and 202, respectively. Each of the input and output faces can be arranged as an actual boundary between different components, substrates, or materials, or can be arranged as an actual or virtual boundary within a component, substrate, or material (e.g., between regions of differing morphology or optical properties). A first general arrangement is depicted schematically in FIGS. 1A and 1B; a second general arrangement is depicted schematically in FIGS. 2A and 2B and includes optical sources 90. The first and second optical diffusers 100/200 are positioned with the output face 102 of the first optical diffuser 100 facing the input face 201 of the second optical diffuser 200, so that the optical diffusers 100 and 200 are arranged in series (i.e., an optical signal encounters the first optical diffuser 100, is redirected, transformed, or transmitted by the diffuser 100, and the redirected, transformed, or transmitted optical signal then encounters the second optical diffuser 200). In some examples the input face 201 of second optical diffuser 200 is positioned against the output face 102 of the first optical diffuser 100 (e.g., as in the generic arrangements of FIGS. 3A and 3C); in other examples the first optical diffuser 100 is spaced apart from the second optical diffuser 200 with an intermediate optical medium 250 between them (e.g., as in the generic arrangements of FIGS. 3B and 3D). FIGS. 1A/1B/2A/2B are intended to illustrate schematically both spaced-apart and positioned-against arrangements; the diffusers 100/200 are shown spaced apart in those drawings to allow the optical signals 20/21 to be shown clearly. In many examples the first and second optical diffusers 100 and 200 are substantially flat with all four input/output faces 101/102/201/202 substantially parallel to one another (as shown in the drawings); in some examples one or more or all of the faces 101/102/201/202 are curved (not shown); in some examples one or more of the faces 101/102/201/202 are nonparallel relative to one or more of the other faces 101/102/201/202 (not shown); all of those arrangements shall fall within the scope of the present disclosure or appended claims.

Each one of the first and second optical diffusers 100/200 can be of any suitable type or arrangement (described further below). The first optical diffuser 100 can include one or more materials among: doped or undoped silicon; one or more doped or undoped III-V or II-VI semiconductors; doped or undoped silicon oxide, nitride, or oxynitride; one or more doped or undoped metal oxides, nitrides, or oxynitrides; one or more optical glasses; one or more doped or undoped polymers; one or more metals or metal alloys; one or more structured metals or metal alloys; one or more doped or undoped 2D or single layer materials; one or more doped or undoped structured 2D or single layer materials; or one or more structured or non-structured phase change materials. Similarly, the second optical diffuser 200 can include any one or more among those materials.

One or more input optical signals 10 propagate toward the first optical diffuser 100 and impinge upon the input face 101; each input optical signal 10 has a corresponding input optical signal wavelength within the operational wavelength range. In some examples the corresponding sources of the optical signals 10 are positioned directly against the input face 101 of the first optical diffuser 100 (e.g., as in the generic arrangements of FIGS. 3A and 3B). In other examples the input optical signals 10 propagate through an input optical medium 150 toward the input face 101 (e.g., as in the generic arrangements of FIGS. 3C and 3D). A portion of each input optical signal 10 is redirected or transformed by the first optical diffuser 100 into a corresponding first forward-directed optical signal 20 that propagates between the first and second optical diffusers 100/200 away from the output face 102 of the first optical diffuser 100. In some examples a portion of each input optical signal 10 is also transmitted (specularly) substantially unchanged by the optical diffuser 100 and propagates between the first and second optical diffusers 100/200 away from the output face 102 of the first optical diffuser 100 as a corresponding first forward-transmitted optical signal 21. Such forward-transmitted optical signals 21 are typically considered undesirable, particularly if portions thereof are also transmitted substantially unchanged through the second optical diffuser 200 (discussed below). Therefore, in some examples the optical diffuser 100 can be arranged specifically so as to reduce, minimize, or eliminate such forward-transmitted optical signals 21, so as to decrease their relative contribution to a collective spatial pattern of illumination intensity.

A portion of each first forward-directed optical signal 20 (and each first forward-transmitted optical signal 21, if present) that is incident on the input face 201 of the second optical diffuser 200 is redirected or transformed by the second optical diffuser 200 into a corresponding second forward-directed optical signal 30 that propagates away from the output face 202 of the second optical diffuser 200. In some examples a portion of each incident first forward-directed optical signal 20 is also transmitted (specularly) substantially unchanged by the optical diffuser 200 and propagates away from the output face 202 of the second optical diffuser 200 as a corresponding second forward-transmitted optical signal 31. The second forward-transmitted optical signals 31 may or may not be deemed undesirable in a given example, because they arise from first forward-directed optical signals 20 that have already been transformed or redirected relative to the corresponding input optical signals 10. Accordingly, the second optical diffuser 200 can in some examples be arranged to reduce, minimize, or eliminate the first forward-transmitted optical signals 31, while such arrangements are not necessarily employed in other examples. However, in some examples a portion of each incident first forward-transmitted optical signal 21, if present, is also transmitted (specularly) substantially unchanged by the optical diffuser 200 and propagates away from the output face 202 of the second optical diffuser 200 as corresponding twice-forward-transmitted optical signal 32. Such twice-forward-transmitted optical signals 32 are typically considered undesirable, and in some examples the optical diffuser 200 is arranged specifically so as to reduce, minimize, or eliminate such twice-forward-transmitted optical signals 32, so as to decrease their relative contribution to a collective spatial pattern of illumination intensity.

As a result of the redirection (e.g., reflection, refraction, diffraction, or scattering), or transformation (e.g., focusing, defocusing, spatial phase or amplitude modulation, mode conversion, or other position-dependent phase transformation) by the first optical diffuser 100, each first forward-directed optical signal 20 differs from the corresponding input optical signal 10 with respect to one or more or all of: (i) a number of corresponding constituent optical beams (e.g., redirection or transformation by non-zero-order diffraction of a single incident beam to produce multiple diffracted beams, or by different spatial portions of a single incident beam being independently redirected by non-zero-order diffraction, or by refraction or reflection, into multiple corresponding forward-directed beams), (ii) propagation direction of one or more of the corresponding constituent optical beams (e.g., redirection or transformation by non-zero-order diffraction, or by refraction or reflection), or (iii) angular divergence of one or more of the corresponding constituent optical beams (e.g., redirection or transformation by refractive or diffractive focusing elements or by refractive or diffractive elements of sufficiently small transverse size). In other words, the first optical diffuser 100 functions as an optical diffuser. As a result of the redirection or transformation by the second optical diffuser 200, each second forward-directed optical signal 30 similarly differs from the corresponding first forward-directed optical signal 20, i.e., the second optical diffuser 200 functions as an optical diffuser. The second forward-directed optical signals 30, thus twice redirected or transformed relative to the corresponding input optical signals 10, form collectively the optical output of the inventive optical apparatus. Any second forward-transmitted optical signals 31 or twice-forward-transmitted optical signals 32 that might be present also contribute to the collective optical output. The inventive optical apparatus can be commonly employed for wide-angle illumination. Indeed, a primary purpose of the inventive optical device is to alter the optical output of one or more optical sources 90 so as to alter the resulting illumination spatial pattern relative to the input optical signals 10 or the twice-forward-transmitted optical signals 32 (e.g., by increasing a collective angular field-of-illumination (FOI), or by altering a collective spatial pattern of illumination intensity).

In FIGS. 1A/1B and 2A/2B the input optical signals 10 are shown impinging upon the input face 101 of the first optical diffuser 100 at substantially normal incidence; in other examples (not shown) the input optical signals 10 can impinge upon the input face 101 at other, non-normal incidence angles. Any suitable or desirable, normal or non-normal incidence angles shall fall within the scope of the present disclosure or appended claims. In some examples all of the input optical signals 10 are incident on the input face 101 of the first optical diffuser 100 at substantially the same angle of incidence; in other examples the angle of incidence on the input face 101 can vary among different input optical signals 10. In FIGS. 1A/1B and 2A/2B each signal beam 10 is shown resulting in two forward-directed signal beams for each forward-directed optical signal 20, and each beam of each forward-directed optical signal 20 is shown resulting in two forward-directed signal beams for each forward-directed optical signal 30. However, those were chosen to avoid cluttering the drawings, and should not be considered as limiting. Each optical diffuser 100/200 can be arranged so as to produce any suitable or desired number of one or more forward-directed beams from each input optical signal 10, or any suitable or desired number of one or more forward-directed beams from each forward-directed signal 20 or forward-transmitted signal 21.

In some examples (e.g., as in FIGS. 3B and 3D), the first and second optical diffusers 100/200 are spaced apart, and each first forward-directed optical signal 20 incident on the input face 201 of the second optical diffuser 200 propagates through an intermediate optical medium 250 (vacuum, gaseous, liquid, or solid) between the output face 102 of the first optical diffuser 100 and the input face 201 of the second optical diffuser 200. The intermediate optical medium 250 is substantially transparent over the operational wavelength range and can include any suitable one or more materials (including, for a solid intermediate optical medium 250, those discussed above) and can be of any suitable thickness. In some specific examples the intermediate optical medium 250 is solid and comprises silica (doped or undoped), optical glass (e.g., borosilicate glasses such as Corning® Eagle XG® or SCHOTT N-SK2), silicon (doped or undoped), or GaAs (doped or undoped), and is greater than about 0.20 mm thick, greater than about 0.40 mm thick, greater than about 0.6 mm thick, greater than about 0.8 mm thick, greater than about 1.0 mm thick, greater than about 1.5 mm thick, greater than about 2.0 mm thick, greater than about 5 mm thick, or greater than about 10. mm thick. In other specific examples the intermediate optical medium 250 is ambient air or inert gas and can assume any of the thicknesses recited above.

Each one of the first or second optical diffusers 100/200 can be of any suitable type or arrangement, e.g., a refractive or diffractive lens array, a refractive or diffractive prism array, a diffractive grating array, a diffuse scatterer, or other suitable diffuser structure (discussed further below). "Array" as used herein encompasses any one- or two-dimensional arrangement of multiple objects (gratings, lasers, lenses, prisms, and so forth), including regular, irregular, periodic, repeating, random, or other arrangement. In some examples the first and second optical diffusers can be of the same type or arrangement; in other examples the first and second optical diffusers 100/200 can be of differing types or arrangements.

In various examples that include a solid intermediate optical medium 250: both of the optical diffusers 100/200 can be attached to the solid intermediate optical medium 250, typically on opposite surfaces thereof (e.g., as in FIG. 4A); both of the optical diffusers 100/200 can be formed on or within the solid intermediate optical medium 250 (e.g., as in FIGS. 4B-4E); or one of the optical diffusers 100/200 can be attached to the solid intermediate optical medium 250 and the other one of the first or second optical diffuser 100 or 200 can be formed on or within the solid intermediate optical medium 250 (e.g., as in FIGS. 4F-4I).

In some examples that include a solid intermediate optical medium 250, an attached optical diffuser 100 or 200 can be formed in a thin, flexible layer that is applied to a corresponding surface of the optical medium (e.g., such a holographic diffuser on a polymer film), or can be formed in or on a substantially rigid substrate (separate from the solid intermediate optical medium 250; not separately labelled in FIG. 4A or 4G-4I) that is attached to a corresponding surface of the optical medium 250. The attachment can be made in any suitable way. In some examples, optical contacting can be employed. In some various examples, a clamp, fastener, retainer, housing, device package, or other mechanical contrivance can be employed. In some examples (e.g., an optical diffuser formed in a polymer film), inherent adhesiveness of the optical diffuser can be relied upon to attach the diffuser to a surface of the optical medium 250. In some examples a suitable adhesive (distinct from the optical diffuser) can be employed that is substantially transparent over the operational wavelength range, so that optical signals can propagate through the adhesive; examples of suitable adhesives can include epoxies or other polymeric adhesives.

In some examples that include a solid intermediate optical medium 250, at least a portion of an optical diffuser 100 or 200 can be formed as a surface relief structure imparted onto a corresponding surface of the optical medium 250, or one or more layers thereon; examples of that general arrangement are illustrated schematically in FIGS. 4B, 4D, 4E, 4F, and 4H. In some various examples, such an optical diffuser 100 or 200 can include one or more layers that are, e.g., spatially selectively: doped, densified, epitaxial, deposited, sputtered, grown, etched, lithographically patterned, photoexposed, stamped, molded, or embossed. In some such examples there is only a single virtual layer comprising material of the optical medium 250, and the optical diffuser 100 or 200 includes a surface relief structure imparted onto that surface using any suitable method, including those listed above. In some other such examples one or more layers of one or more materials different from the optical medium 250 are formed on a corresponding surface of the optical medium 250. Each such layer is formed either directly on the surface of the optical medium 250 or on one of the other layers of the optical diffuser 200 (if more than one layer is present; in some such multilayer examples, the optical diffuser 100 or 200 can include one or more layers of the same material as the optical medium 250). The surface relief structure of the optical diffuser 100 or 200 can be arranged to form, e.g., a refractive or diffractive surface lens array, a refractive or diffractive surface prism array, a diffractive surface grating array, a surface diffuse scatterer, combinations thereof, or other suitable diffuser structure.

As an aside, spatially selective processing to form a surface relief structure as an optical diffuser (as described in the preceding paragraph) can also be advantageously employed in examples wherein the first and second optical diffusers 100/200 are positioned against one another (e.g., as in FIGS. 3A and 3C, with no intermediate optical medium 250 between them). In some examples, any suitable spatially selective processing can be employed to form the first optical diffuser 100 as a surface relief structure, e.g., on a first diffuser substrate 105. A suitable optical medium can be deposited to fill recessed regions of the surface relief structure and then planarized, e.g., by chemical-mechanical polishing or other suitable technique; in some instances an additional planarized layer can be formed on the first optical diffuser 100. Additional spatially selective processing can be employed to form the second optical diffuser 200 as a surface relief structure on the planarized surface of the first optical diffuser 100 or on the planarized surface of the additional layer (if present). Alternatively, the second optical diffuser 200 can be attached to the planarized surface of the first optical diffuser 100 or to the planarized surface of the additional layer (if present). In such examples, the second optical diffuser 200 can be formed in a thin, flexible layer that is applied to the planarized surface (e.g., such a holographic diffuser on a polymer film), or can be formed in or on a substantially rigid substrate that is attached to the planarized surface in any suitable way (e.g., adhesive, optical contacting, mechanical retention, and so forth).

In some examples that include a solid intermediate optical medium 250, at least a portion of an optical diffuser 100 or 200 is formed within the solid intermediate optical medium 250; examples of that general arrangement are illustrated schematically in FIGS. 4C, 4D, 4E, 4G, and 4I. In such examples the optical diffuser 100 or 200 includes one or more volumes within the optical medium 250 that are, e.g., spatially selectively: doped, densified, epitaxial, deposited, sputtered, grown, etched, lithographically patterned, or photoexposed. The volumes of the optical diffuser 100 or 200 thus processed can be arranged to form, e.g., a refractive or diffractive volume lens array, a refractive or diffractive volume prism array, a diffractive volume grating array, a volume diffuse scatterer, or other suitable diffuser structure. Typically an optical diffuser formed within a solid optical medium or substrate is nevertheless quite near to a surface thereof and can be considered functionally to be "at" that surface. However, that need not always be the case, and embodiments including one or more optical diffusers formed anywhere within a solid optical medium or substrate shall fall within the scope of the present disclosure or appended claims.

Figure 5A:
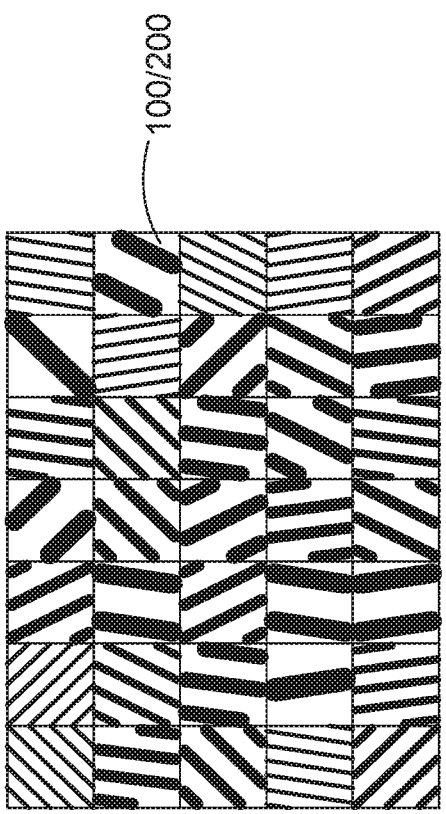
FIGS. 5A through 5D illustrate schematically various optical diffuser types.
Figure 5B:
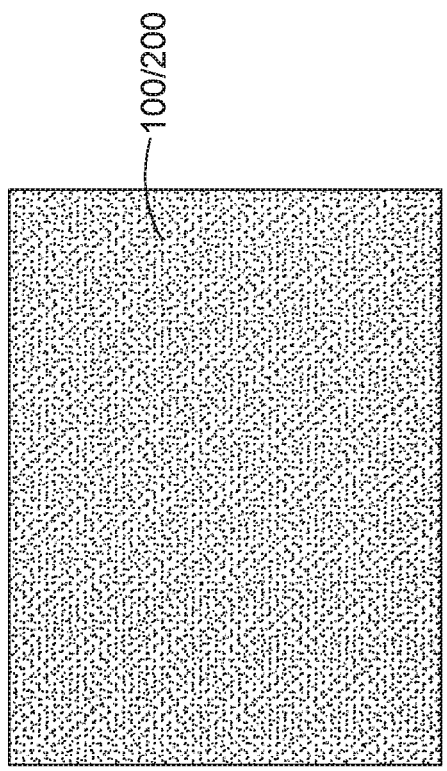
Figure 5C:
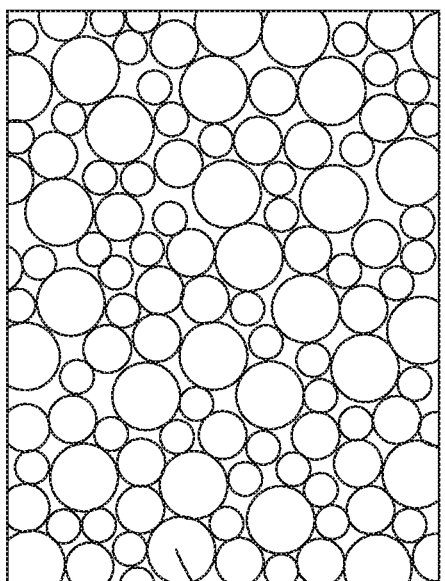
Figure 5D:
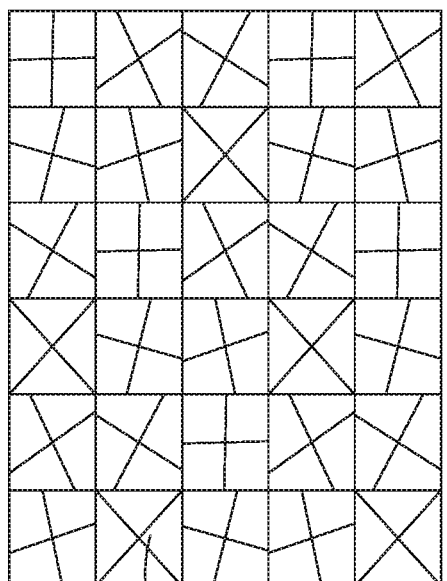

Examples of optical diffusers 100 or 200 can include a regular or irregular array of refractive or diffractive lenses (e.g., illustrated schematically in FIG. 5A), a regular or irregular array of diffraction gratings (e.g., illustrated schematically in FIG. 5B), regular or irregular array of refractive or diffractive prisms (e.g., illustrated schematically in FIG. 5C), a diffuse scatterer (e.g., illustrated schematically in FIG. 5D), or a combination of any two or more of those. Examples of such diffusers are known in the art. In some examples the optical diffusers 100 and 200 can be of the same general type; in other examples the optical diffusers can be of different general types. As already noted, the first optical diffuser 100 can be arranged so as to produce, from the input optical signals 10 propagating toward the input face 101, the first forward-directed optical signals 20, the second optical diffuser 200 can be arranged so as to produce, from the first forward-directed optical signals 20 propagating toward the input face 201, the second forward-directed optical signals 30. It is the second forward-directed optical signals 30 that are intended to form collectively most or all of the optical output of the inventive apparatus (e.g., the illumination light from an illumination source). In some examples the second forward-transmitted optical signals 31 (if any) can also form a portion of the optical output. The first or second optical diffusers 100 and 200 can also be arranged in any suitable way to reduce, minimize, or eliminate transmission of the first forward-transmitted optical signal 21 or the twice-forward-transmitted optical signals 32, so as to reduce or eliminate their contribution to the optical output of the inventive apparatus. For example, an array of lenses, prisms, or gratings can be fabricated without leaving any gaps between them through which portions of the input optical signals 10 could leak to form the first forward-transmitted optical signals 21, or through which portions of the first forward-transmitted optical signals 21 could leak to form the twice-forward-transmitted optical signals 32. In another example, an array of diffraction gratings can be fabricated so as to reduce, minimize, or eliminate zero-order transmission, which in such grating-based diffusers is a source of forward-transmitted optical signals 21/31 and twice-forward-transmitted optical signal 32.

In some various examples, the first or second forward-directed optical signals 20 or 30 can be formed at least partly by diffuse scattering by the first or second optical diffusers 100 or 200, respectively. In some of those examples, the first or second optical diffuser 100 or 200 can include a diffuse scatterer that can include one or more of a holographic diffuser layer, a ground or etched glass layer, a ground or etched polymer layer, opal glass, white diffusing glass, a surface scatterer, or a volumetric scatterer.

In some various examples, the first or second forward-directed optical signals 20 or 30 can be formed at least partly by two or more specular reflections or by one or more specular reflections in combination with one or more refractions, by the first or second optical diffusers 100 or 200, respectively. In some various examples, the first or second optical diffuser 100 or 200 can include an array of refractive or diffractive lenses; in some various examples, the first or second optical diffuser 100 or 200 can include an array of refractive or diffractive prisms. Refractive or diffractive elements of an array of lenses or prisms can be formed as surface elements or volume elements. In some examples, one or more or all of the lenses or prisms of the array can be positioned or arranged so as each to receive at least a portion of two or more of the input optical signals 10 (on the first optical diffuser 100) or two or more first forward-directed optical signals 20 (on the second optical diffuser 200). Instead or in addition, in some examples, each of one or more or all input optical signals 10 illuminate multiple lenses or prisms (on the first optical diffuser 100) or each of one or more or all first-forward-directed optical signals 20 illuminate multiple lenses or prisms (on the second optical diffuser 200). In one or both of those ways (lenses/prisms illuminated by multiple signals 10 or 20; signals 10 or 20 illuminating multiple lenses/prisms), one or more of all of the optical signals 10 or 20 can create additional "virtual optical sources" in additional to the actual optical sources 90 (discussed further below).

In some various examples, the first or second forward-directed optical signals 20 or 30 can be formed at least partly by non-zero-order transmissive diffraction, by the first or second optical diffusers 100 or 200, respectively. In some of those examples, the non-zero-order transmissive diffraction includes diffraction into multiple non-zero diffractive orders; in some other of those examples, the non-zero-order transmissive diffraction includes diffraction into only a single non-zero diffractive order. In some examples, the first or second optical diffuser 100 or 200 can include an array of diffraction gratings. In some examples, one or more or all gratings of the array can be positioned and arranged so as each to receive at least a portion of two or more of the input optical signals 10 (on the first optical diffuser 100) or two or more of the first forward-directed optical signals 20 (on the second optical diffuser 200). Instead or in addition, in some examples, each of one or more or all of the input optical signals 10 illuminate multiple gratings (on the first optical diffuser 100) or each of one or more or all of the first-forward-directed optical signals 20 illuminate multiple gratings (on the second optical diffuser 200). In one or both of those ways (gratings illuminated by multiple signals 10 or 20; signals 10 or 20 illuminating multiple gratings), one or more or all of the optical signals 10 or 20 can create additional "virtual optical sources" in additional to the actual optical sources 90 (discussed further below). The diffraction gratings of the array can comprise surface gratings (e.g., ruled, etched, or holographic) or volume gratings (e.g., Bragg or holographic). Some examples of a suitable array of diffraction gratings are disclosed in U.S. provisional App. No. 62/784,484 filed Dec. 23, 2018 and U.S. non-provisional application Ser. No. 16/525,574 filed Jul. 30, 2019, both filed in the names of Mossberg et al, both entitled "Diffraction grating array for wide-angle illumination", and referred to herein as the "grating array" applications; both of said applications are incorporated by reference as if fully set forth herein.

In some examples, the solid intermediate optical medium 250 is a monolithic volume of one or more solid materials (including any of those described above) and both of the optical diffusers 100 and 200 are attached to, formed on, or formed within the monolithic volume. The examples of FIGS. 4A through 4I are arranged thus. In other examples the first optical diffuser 100 is attached to, formed on, or formed within a first diffuser substrate 105 (in any suitable way, including those described above), and the second optical diffuser 200 is attached to, formed on, or formed within a second diffuser substrate 205 (in any suitable way, including those described above). The diffuser substrates 105 and 205 are distinct substrates, each can include any one or more suitable materials (including those described above), and they can be attached together in one of four distinct arrangements that are illustrated schematically in FIGS. 6A through 6D. Each of the diffuser substrates can comprise any one or more suitable materials, including those described above.

Figure 6B:
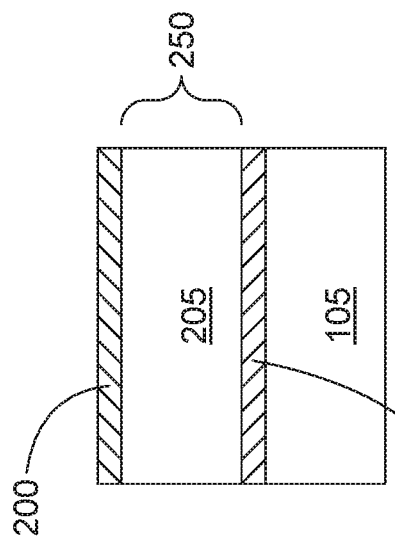
FIG. 6A through 6D illustrate schematically the first and second optical diffusers, each attached to or formed on or in a corresponding diffuser substrate, attached together in various arrangements.
Figure 6D:
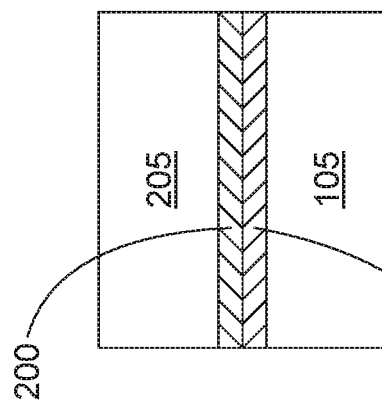
Figure 6A:
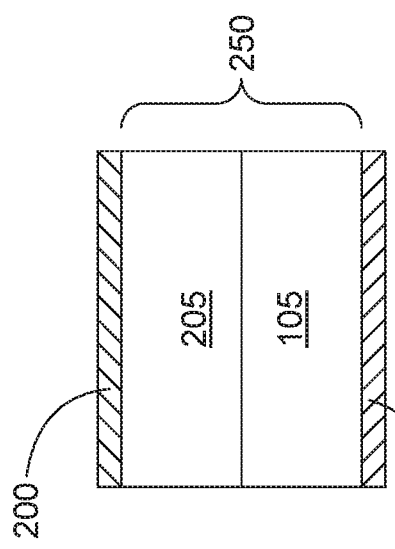
Figure 6C:
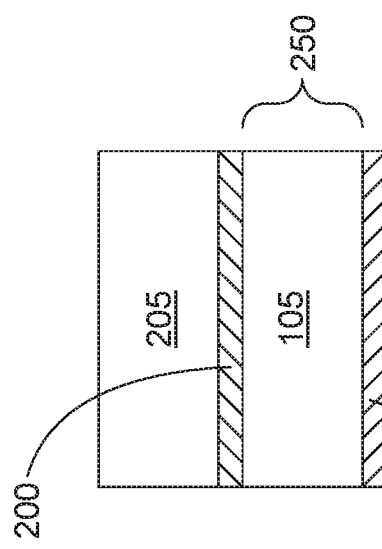
Figure 8A:
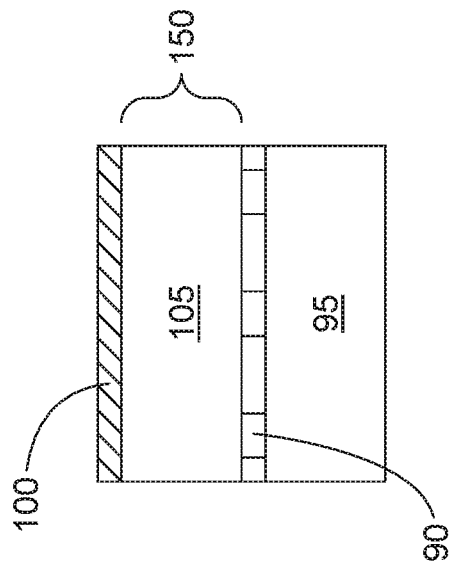
FIG. 8A through 8D illustrate schematically the optical sources and the first optical diffuser, each attached to or formed on or in a corresponding source or diffuser substrate, attached together in various arrangements.
Figure 8B:
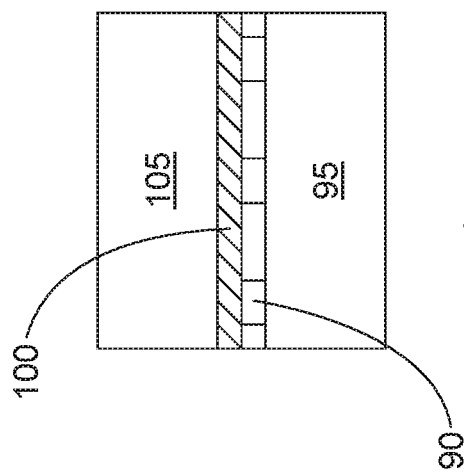
Figure 8C:
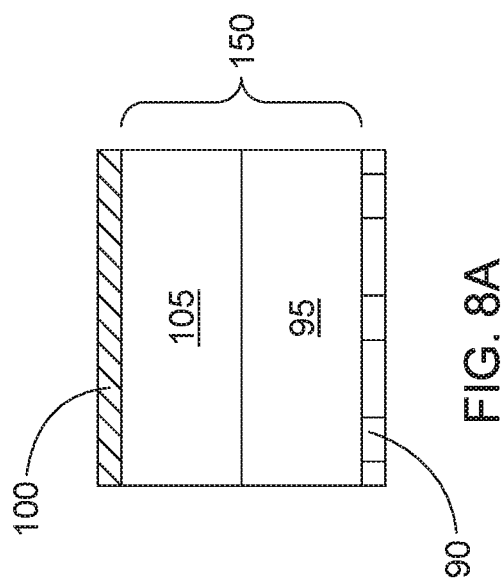
Figure 8D:
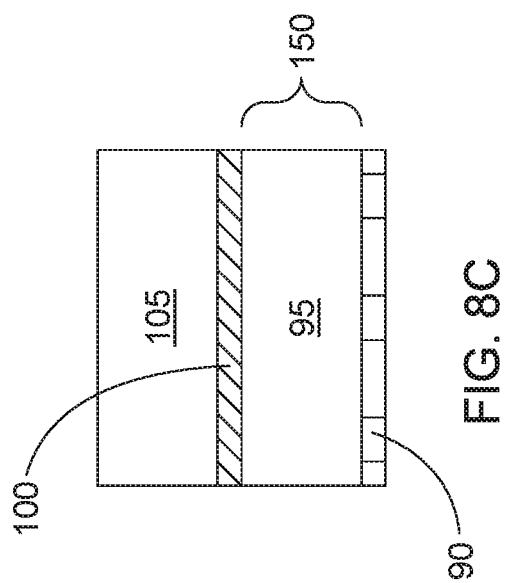

In FIG. 6A the optical diffusers 100 and 200 are arranged "back-to-back" with most or all of the diffuser substrates 105 and 205 between the diffusers 100 and 200. In that arrangements the diffuser substrates 105 and 205 together form the solid intermediate optical medium 250. In FIG. 6B the optical diffusers 100 and 200 are arranged "front-to-back" with the second diffuser substrate 205 forming much or all of the solid intermediate optical medium 250; if the first optical diffuser 100 is formed within the first diffuser substrate 105, a portion of the diffuser substrate 105 against the output face 102, if any, can form a portion of the intermediate optical medium 250. In FIG. 6C, the optical diffusers 100 and 200 are arranged "back-to-front" with the first diffuser substrate 105 forming much or all of the solid intermediate optical medium 250; if the second optical diffuser 200 is formed within the second diffuser substrate 205, a portion of the diffuser substrate 205 against the input face 201, if any, can form a portion of the intermediate optical medium 250. In FIG. 6D the optical diffusers 100 and 200 are arranged "front-to-front". In some such examples the output face 102 of the first optical diffuser 100 is positioned against the input face 201 of the second optical diffuser 200 so that there is no intermediate optical medium 250 between the optical diffusers 100/200 (as shown). In some front-to-front examples in which one or both optical diffusers 100 or 200 are formed within the respective diffuser substrates 105 or 205, portions of the diffuser substrates 105 or 205, against the output face 102 or the input face 201, respectively, can form the intermediate optical medium 250 (not shown). In some examples, both optical diffusers 100 and 200 can be attached to, formed in, or formed on the respective diffuser substrates 105 and 205 before attachment of the substrates 105 and 205 together or after that attachment; alternatively, in some examples one of the optical diffusers 100 or 200 can be attached or formed before attachment of the diffuser substrates 105 and 205 together and the other optical diffuser can be attached or formed afterward.

In some examples in which the first and second optical diffusers 100 and 200 are spaced apart, each first forward-directed optical signal 20 that is incident on the input face 201 of the second optical diffuser 200 propagates between the output face 102 of the first optical diffuser 100 and the input face 201 of the second optical diffuser 200 through an intermediate optical medium 250 that at least partly comprises vacuum or a liquid or gaseous optical medium. In some of those examples, the vacuum or the liquid or gaseous optical medium 250 is ambient and allowed to enter, flow, or reside between the optical diffusers 100 and 200. In other examples, the volume between the optical diffusers 100 and 200 is closed off from its surroundings and either evacuated or filled with a liquid or gaseous intermediate optical medium 250. Any suitable liquid or gaseous optical medium can be employed as the intermediate optical medium 250, e.g., one or more of atmospheric air, inert or noble gas or gas mixture, water, an aqueous solution or mixture, an organic liquid or solution or mixture, index-matching fluid, and so on.

Whether separated by an intermediate optical medium 250 that comprises vacuum, a liquid or gaseous intermediate optical medium, a monolithic solid intermediate optical medium, or one or both diffuser substrates 105 or 205, or a combination of two or more of those, in various examples the output face 102 of the first optical diffuser 100 and the input face 201 of the second optical diffuser 200 can be spaced apart by more than about 0.20 mm, more than about 0.4 mm, more than about 0.6 mm, more than about 0.8 mm, more than about 1.0 mm, more than about 1.5 mm, more than about 2.0 mm, more than about 5 mm, or more than about 10. mm. The separation between the first and second optical diffusers 100 and 200 can affect various performance characteristics of the optical apparatus (discussed further below). One or more such performance characteristics can be improved or optimized by suitable selection of that separation between the optical diffusers 100 and 200.

Whether separated by an intermediate optical medium 250 that comprises vacuum, a liquid or gaseous intermediate optical medium, a monolithic solid intermediate optical medium, or one or both diffuser substrates 105 or 205, or a combination of two or more of those, in various examples the optical apparatus can further include one or more intermediate lateral surfaces 255 positioned and arranged so as to (i) at least partially encircle a volume between the first and second optical diffusers 100 and 200 and (ii) reflect toward the input face 201 of the second optical diffuser 200 at least a portion of each first forward-directed optical signal 20 that impinges upon one of the intermediate lateral surfaces 255. In such an arrangement (illustrated schematically in, e.g., FIGS. 1B and 2B), first forward-directed optical signals 20 (or portions thereof) that might otherwise have missed the second optical diffuser 200 are contained between the optical diffusers 100 and 200 and are reflected toward the second optical diffuser 200. In some examples the intermediate lateral surfaces 255 can include one or more boundaries between (i) the intermediate optical medium 250 between the optical diffusers 100 and 200 (e.g., intermediate vacuum, gas, liquid, or solid) and (ii) an ambient optical medium (e.g., ambient vacuum, gas, liquid, or solid) that at least partly encircles the intermediate optical medium 250 and is in contact with the intermediate optical medium 250 (e.g., as ambient vacuum or atmospheric air, immersion liquid, or a solid encapsulant). In some examples the intermediate lateral surfaces 255 can include a solid barrier between the intermediate and ambient media. In some examples, the one or more intermediate lateral surfaces 255 can be positioned and arranged so that one or more of the first forward-directed optical signals 20 impinging thereupon are partially reflected (e.g., by Fresnel reflection at incidence below the critical angle or by an intermediate lateral reflective layer or coating) or totally internally reflected (e.g., by Fresnel reflection at incidence above the critical angle or by an intermediate lateral reflective layer or coating). Fresnel reflection (partial or total internal) can arise from index contrast between the intermediate optical medium 250 and the ambient medium or (if present) the solid barrier. The intermediate lateral reflective layer or coating can comprise a metal layer, a single-layer dielectric or semiconductor coating, or a multi-layer dielectric or semiconductor coating, and can be applied to outward-facing lateral surfaces of a solid intermediate optical medium 250 (if present), to inward-facing surfaces of a solid ambient medium (if present), or to a surface of a solid barrier (if present) between the intermediate and ambient media.

Figure 2A:
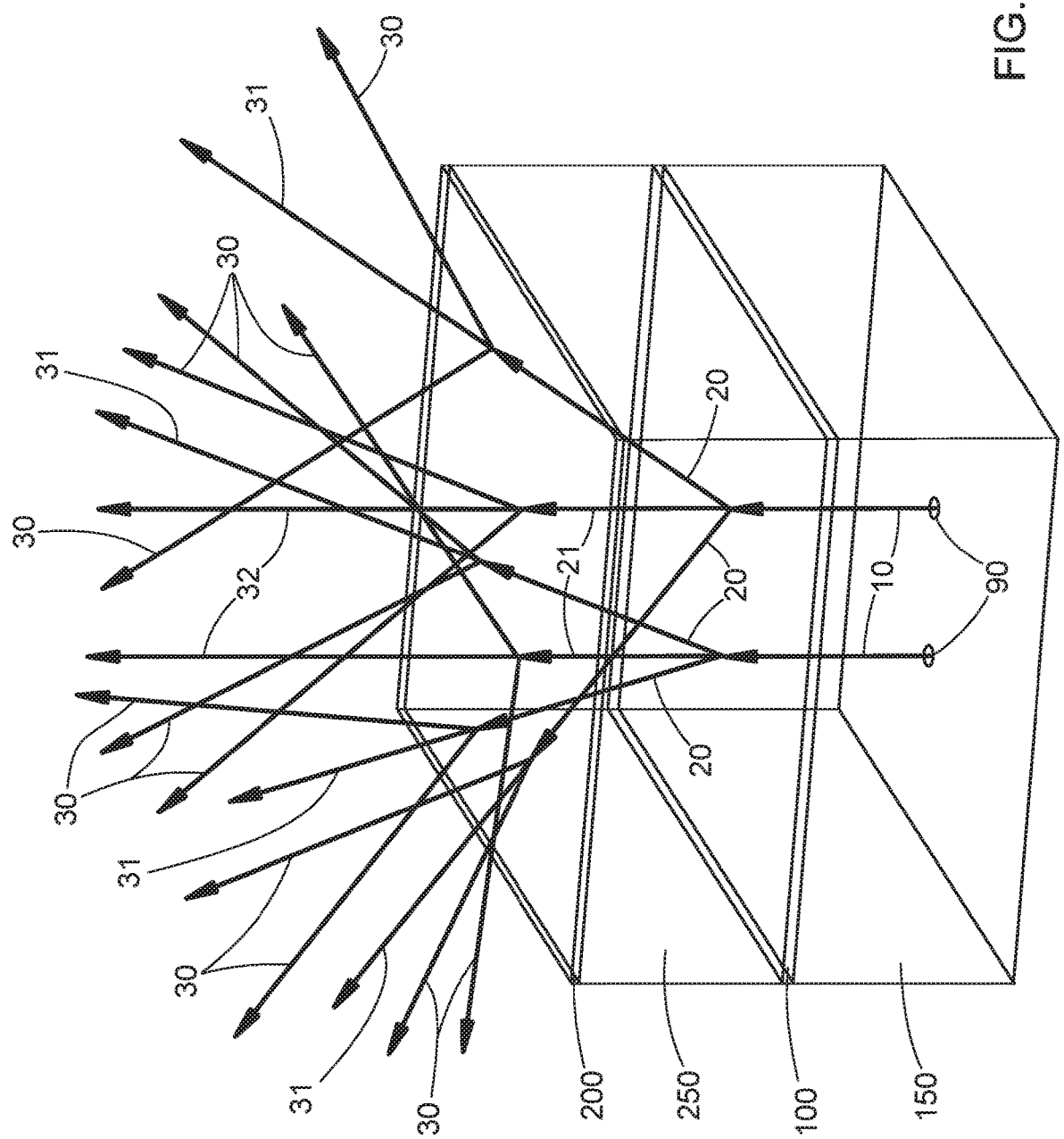
FIGS. 2A and 2B are schematic perspective and side views, respectively, of a general arrangement of an inventive optical device including first and second optical diffusers and optical sources.

One or more optical sources 90 that emit within the operational wavelength range can be employed to produce the input optical signals 10 (not shown in FIGS. 1A/1B; shown in FIGS. 2A/2B). The optical sources can be of any suitable type or arrangement (discussed further below). Examples of suitable optical sources can include, e.g., light-emitting diodes (LEDs) or lasers, including semiconductor lasers such as edge-emitting laser diodes or vertical-cavity surface-emitting lasers (VCSELs). Some examples of an inventive optical apparatus can include the one or more optical sources 90 that produce the input optical signals 10. Any suitable position or arrangement of the first and second optical diffusers 100 and 200 relative to the optical sources 90 can be employed that result in the corresponding forward-propagating input optical signals 10 being incident on the input face 101 of the first optical diffuser 100. In some examples the optical sources 90 are positioned against the input face 101 of first optical diffuser 100 (e.g., as in the generic arrangements of FIGS. 3A and 3B); in other examples the optical sources 90 are spaced apart from the first optical diffuser 100 with an input optical medium 150 between them (e.g., as in the generic arrangements of FIGS. 3C and 3D). FIGS. 2A/2B are intended to illustrate schematically both spaced-apart and positioned-against arrangements; the sources 90 and first diffuser 100 are shown spaced apart in those drawings to allow the optical signals 10 to be shown clearly.

In some examples, the optical sources 90 can be attached to or formed on the first optical diffuser 100 (e.g.: on or against input face 101 of the first optical diffuser 100 in the arrangements of FIG. 3A, 3B, 4A, 4B, 4E, 4F, 4H, 4I, 6A, 6C, or 8D (optical sources 90 not shown in FIGS. 4A, 4B, 4E, 4F, 4H, 4I, 6A, and 6C); on or in or against the first diffuser substrate 105 and thereby spaced apart by the input optical medium 150 from the input face 101 in the arrangements of FIG. 6B, 6D, 7A-7I or 8A-8C (optical sources 90 not shown in FIGS. 6B and 6D); on or against the substrate 105 or the solid intermediate optical medium 250 and thereby spaced apart from the input face 101 by the input optical medium 150 in the arrangements of FIG. 4C, 4D, 4G, 6A, 6C, or 8D wherein some material of the solid intermediate optical medium 250 or the first diffuser substrate 105 lies between the input face 101 and the optical sources 90 (optical sources 90 not shown in FIGS. 4C, 4D, 4G, 6A and 6C); spaced apart from the input face 101 or the substrate 105 by the input optical medium 150 that comprises vacuum, a gaseous or liquid ambient medium, or a contained gaseous or liquid input optical medium). In some examples the one or more optical sources 90 and the first optical diffuser 100 can be attached to, formed on, or formed within a solid input optical medium 150 in one of the various arrangements of FIGS. 7A-7I (analogous to the arrangements of the first and second optical diffusers 100/200 on/in the solid intermediate optical medium 250 shown in FIGS. 4A-4I). In some examples the one or more optical sources 90 can be attached to, formed on, or formed within a distinct source substrate 95 that is attached to the first optical diffuser 100, in one of the various arrangements of FIGS. 8A-8D (analogous to the arrangements of the first and second optical diffusers 100/200 on/in diffuser substrates 105/205 shown in FIGS. 6A-6D). The source substrate 95 can comprise any one or more suitable materials, including those disclosed above. All the analogous arrangements, materials, methods of attachment, and methods of forming can be applied to the optical sources 90 and the first optical diffuser 100 as described above for the optical diffusers 100 and 200, and so need not be repeated here. In some of those examples, the one or more optical sources 90 are spaced apart from the input face 101, and the input optical signals 10 propagate toward the input face 101 through an input optical medium 150 that comprises at least a portion of the source substrate 95, at least a portion of the first substrate 105 (if present), or at least a portion of the intermediate optical medium 250 (if present). Regardless of the specific arrangements, the optical output of each optical source 90 propagates as one of the forward-propagating input optical signals 10 toward and incident on the input face 101 of the first optical diffuser 100.

If spaced apart, in various examples the optical sources 90 and the input face 101 of the first optical diffuser 100 can be spaced apart by more than about 0.20 mm, more than about 0.4 mm, more than about 0.6 mm, more than about 0.8 mm, more than about 1.0 mm, more than about 1.5 mm, or more than about 2.0 mm, more than about 5 mm, or more than about 10. mm. As noted above, in some examples an input optical medium 150 between the optical sources 90 and the input face 101 comprises vacuum, an ambient gaseous or liquid medium, or a contained gaseous or liquid input optical medium. Also noted above, in some examples an input optical medium 150 between the optical sources and the input face 101 can comprise one or more or all of (i) a portion of the first diffuser substrate 105, (ii) a portion of the source substrate 95, or (iii) an interposed solid optical medium distinct from the diffuser substrate 105 and the source substrate 95.

Whether separated by vacuum, a liquid or gaseous intermediate optical medium, the first diffuser substrate 105, the source substrate 95, or a distinct solid optical medium, in various examples the optical apparatus can further include one or more input lateral surfaces 155 positioned and arranged so as to (i) at least partially encircle a volume between the optical sources 90 and first optical diffuser 100 and (ii) reflect toward the input face 101 of the first optical diffuser 100 at least a portion of each input optical signal 10 that impinges upon one of the input lateral surfaces 155. In such an arrangement (illustrated schematically in, e.g., FIGS. 1B and 2B), input optical signals 10 (or portions thereof) that might otherwise have missed the first optical diffuser 100 are contained between the optical sources 90 and the first optical diffuser 100 and are reflected toward the first optical diffuser 100. The input lateral surfaces 155 can be arranged in any suitable way, including those described above for the intermediate lateral surfaces 255.

In FIGS. 2A/2B the input optical signals 10 launched by the optical sources 90 are shown propagating toward the first optical diffuser 100 in a direction substantially normal to the input face 101; in other examples (not shown) the input optical signals 10 launched by the optical sources 90 can propagate toward the first optical diffuser 100 in other, non-normal directions relative to the input face 101. Any suitable or desirable, normal or non-normal propagation directions shall fall within the scope of the present disclosure or appended claims. In some examples all of the optical sources 90 emit input optical signals 10 that propagate in substantially the same direction (i.e., substantially parallel to one another); in other examples the propagation direction can vary among different input optical signals 10 launched by different corresponding optical sources 90.

As noted above, any suitable optical sources can be employed (to produce input optical signals 10 as in FIGS. 1A/1B, or to be included in the inventive optical apparatus as in FIGS. 2A/2B) that emit within the operational wavelength range. Any suitable operational wavelength range can be employed. In some various examples, the operational wavelength range can include a span of wavelengths that are larger than about 0.20 μm, larger than about 0.4 μm, or larger than about 800 nm, or can include a span of wavelengths that are smaller than about 10. μm, smaller than about 2.5 μm, or smaller than about 1000 nm. In some various examples employing multiple optical sources 90, the corresponding incident wavelengths can all lie within about 5 nm of a nominal incident wavelength within the operational wavelength range, within about 2.0 nm of a nominal incident wavelength within the operational wavelength range, or within about 1.0 nm of a nominal incident wavelength within the operational wavelength range.

Suitable optical sources (sources 90, or sources of input signals 10) can include one or more light-emitting diodes or one or more semiconductor lasers. A common arrangement is a two-dimensional array of semiconductor lasers; VCSELs are commonly arranged thus. The lasers of such an array can be at least partly formed on or within the first diffuser substrate 105, employing any suitable spatially selective material processing methods, including those discussed above; in such an instance the first diffuser substrate 105 also acts as the source substrate 95 and the input optical medium 150. Alternatively, the lasers of such an array can be at least partly positioned on a common source substrate 95 (of any suitable one or more materials, including those described above) that is attached to the first diffuser substrate 105 or an intervening optical medium in any suitable way (including those discussed above, such as optical contacting, mechanical contrivances, a housing, a device package, or substantially transparent adhesive); an example of that general arrangement is illustrated schematically in FIGS. 8A-8D).

To construct various examples of an inventive illumination source, each arrangement for joining together the first and second optical diffusers 100/200 among those of FIG. 4A-4I or 6A-6D can be combined with any compatible arrangement for joining together the optical sources 90 and the first optical diffuser 100 among those of FIG. 7A-7I or 8A-8D. To construct other various examples of an inventive illumination source, each arrangement for joining together the first and second optical diffusers 100/200 among those of FIG. 4A-4I or 6A-6D can be joined with optical sources 90 (e.g., by a housing or device package) that are separated from the first optical diffuser 100 by an input optical medium 150 that is vacuum, gaseous, or liquid. To construct other various examples of an inventive illumination source, each arrangement for joining together the optical sources 90 and the first optical diffuser 100 among those of FIG. 7A-7I or 8A-8D can be joined with a second optical diffuser 200 (e.g., by a housing or device package) that are separated from the first optical diffuser 100 by an intermediate optical medium 250 that is vacuum, gaseous, or liquid. To construct other various examples of an inventive illumination source, a first optical diffuser 100 can be joined with optical sources 90 (e.g., by a housing or device package) that are separated from the first optical diffuser 100 by an input optical medium 150 that is vacuum, gaseous, or liquid, and a second optical diffuser 200 can be joined with the first optical diffuser 100 (e.g., by a housing or device package) that is separated from the second optical diffuser 200 by an intermediate optical medium 250 that is vacuum, gaseous, or liquid.

In the field of wide-angle illumination, use of lasers as optical sources enables high levels of illumination to be produced relatively efficiently using a relatively compact device. One undesirable trait of illumination with lasers is the appearance of noise due to laser speckle, which arises when a coherent, relatively monochromatic optical signal interacts with a target surface or target object that is not perfectly smooth; light scattered from different target areas constructively or destructively interfere depending on the viewing angle. Speckle occurs even with broadband sources of illumination, but the speckle pattern is washed out due to the many different wavelengths present that generate correspondingly many different spatial distributions of speckle. With a narrowband source such as a laser, the speckle becomes more readily apparent, and can become a source of unwanted optical noise or interference in certain illumination applications (e.g., structured light for gesture sensing, 2D illumination based facial recognition, or time-of-flight 3D sensing). Speckle can also arise in some instances from interference effects within a coherent optical source such as a laser. The use of an array of multiple laser sources that are not mutually coherent can reduce, but typically does not eliminate, the effect of speckle.

Figures 9A, 9B:
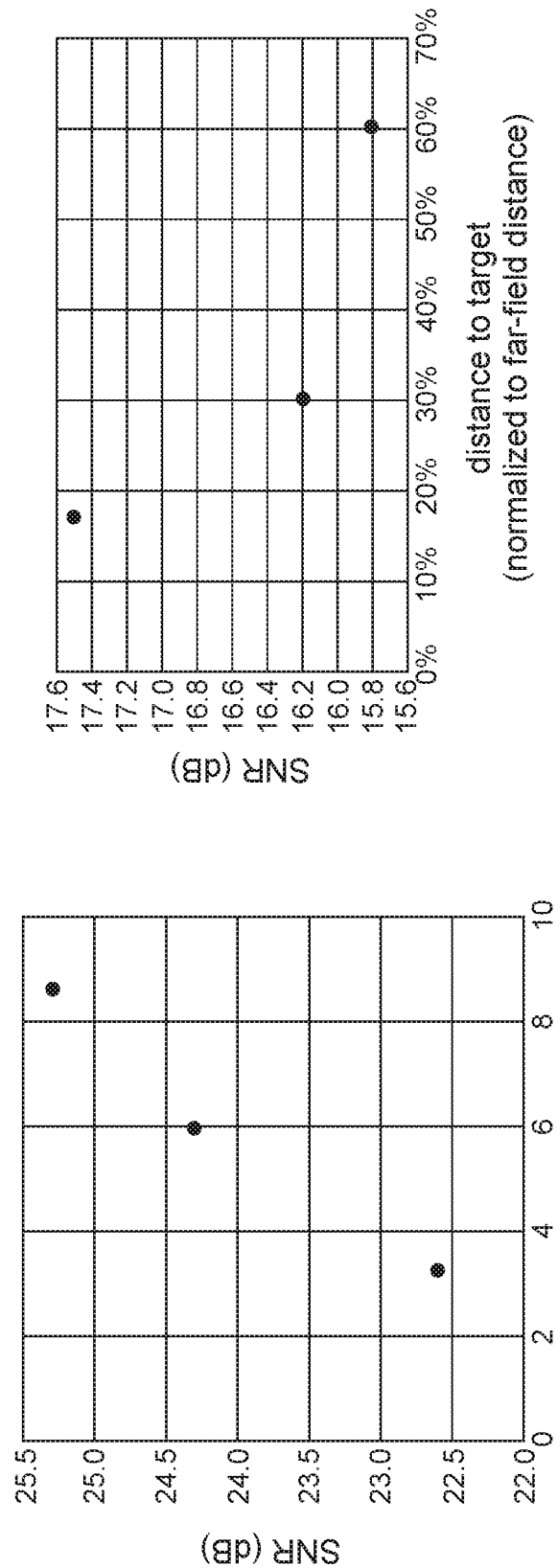
FIGS. 9A through 9D are graphs illustrating examples of speckle noise reduction.

The inventive apparatus can be employed to reduce further the effects of laser speckle (whatever its source). In some examples, relative to an otherwise identically arranged reference device which includes either only the first optical diffuser 100 or only the second optical diffuser 200, but not both, the inventive optical apparatus, which includes both the first and second optical diffuser 100 and 200, can exhibit an increased signal-to-noise ratio (due reduction of noise due to laser speckle). The signal-to-noise ratio (SNR) can be defined as average intensity divided by the standard deviation of intensity averaged over a suitably large illuminated area. In some various examples, the increase of the signal-to-noise ratio exhibited by the optical output can be more than about 2.0 dB, more than about 3.0 dB, more than about 4.0 dB, or more than about 5 dB or even 10. dB. Some example measurements are shown in the graph of FIG. 9C, in which are plotted speckle signal-to-noise ratios (SNRs) for (i) a conventional VCSEL array and a single optical diffuser, (ii) a VCSEL array and a single optical diffuser arranged according to the "back-direction" applications (discussed further and incorporated by reference below), and (iii) an inventive illumination source comprising the VCSEL array and first optical diffuser 100 (arranged according to the "back-direction" applications) in combination with a second optical diffuser 200 spaced apart from the first optical diffuser 100 as disclosed herein. For those plotted examples, the input optical signals 10 have a spectral bandwidth that is about 1.0 nm wide (full width at half-maximum intensity; FWHM) centered at about 940 nm and a coherence length of about 800 μm. For the plotted inventive example: the first and second optical diffusers are about 2.3 mm apart and separated by ambient air; a glass-based second diffuser 200 faces a first diffuser 100 integrally formed on the back side of a GaAs source substrate 95 that is about 0.625 mm thick; and an array of VCSEL sources 90 are formed on the front side of the source substrate 95 and arranged as backside emitters. The specific arrangement therefore resembles FIG. 7B with a GaAs input optical medium 150 and with the second optical diffuser separated from the first optical diffuser 100 by a gaseous intermediate optical medium 250.

An advantageous effect of the presence of two optical diffusers 100 and 200 in series is an increase in the effective size of an illumination source comprising the optical sources 90. The first-forward-directed optical signals 20 are spread over a wider angular range than the input optical signals 10, so that an area of the second optical diffuser 200 is illuminated by the first forward-directed optical signals 20 that is larger than an area of the first optical diffuser 100 illuminated by the input optical signals 10. Any increase in the apparent or effective area of an extended optical source (i.e., the illuminated area of the second optical diffuser 200) results in reduced speckle. Speckle patterns arising from illumination light emanating from different spatial regions of such an extended source differ from one another and therefore tend to wash out (due to different incidence angles on a target surface or object; in fact it is the solid angle subtended by the illumination source when viewed from the target that is the relevant parameter, which depends on both the area of the illumination source as well as the distance to the target). That washing-out becomes more pronounced as the effective size of the extended source increases and therefore provides a wider range of incidence angles (for a fixed distance to the target). That effect is apparent in the test data shown in FIGS. 9A and 9B. In FIG. 9A the area of an inventive illumination source (including two diffusers 100/200) is altered by partial occlusion (by moving a straight-edge across the input face 201 of the second optical diffuser 200 with the target at a fixed distance), and the signal-to-noise ratio due to speckle is observed to increase with increasing illuminated area of the second optical diffuser 200. In FIG. 9B, signal-to-noise ratio due to speckle is observed to increase as a conventional illumination source (with only a single diffuser) moves closer to the target (thereby increasing the solid angle subtended by the illumination source viewed from the target); a similar effect would be expected to be observed using an inventive illumination source.

In one specific inventive example (that was used to generate some of the data shown in FIGS. 9A, 9C, and 9D), an array of optical sources 90 that is 0.33 mm×0.99 mm (about 0.33 mm$^2$) directly illuminates an area of a first optical diffuser 100 that is about 0.41 mm×1.07 mm (about 0.44 mm$^2$) due to divergence of the input optical signals 10 (numerical aperture of about 0.2 in GaAs in this example) and the thickness of the GaAs source substrate 95 (about 0.625 mm in this example). The area of the second optical diffuser 200 directly illuminated is about 2.75 mm×2.7 mm (about 7.4 mm$^2$) due to the action of the first optical diffuser 100 (which in this example produces an angular field of illumination of about 45° by 60° and is separated from the second optical diffuser by about 2.3 mm of ambient air to generate data in FIGS. 9A and 9C, or by a range of separation distances through ambient air to generate data in FIG. 9D).

Figure 9D:
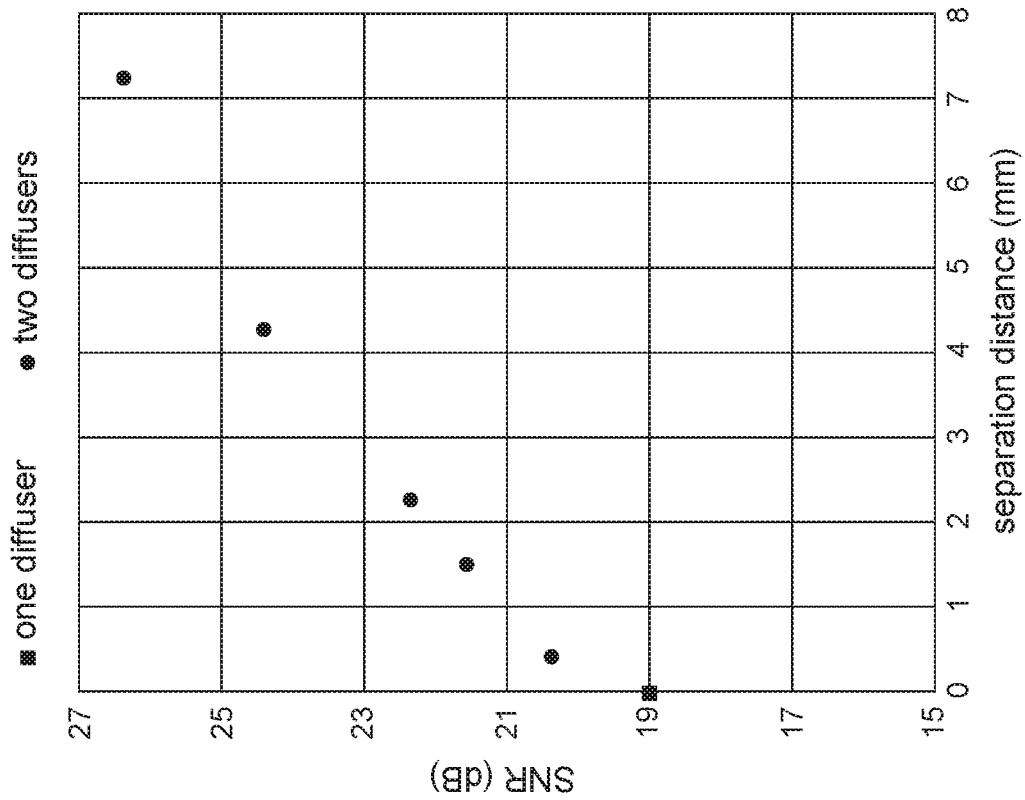
Figure 9C:
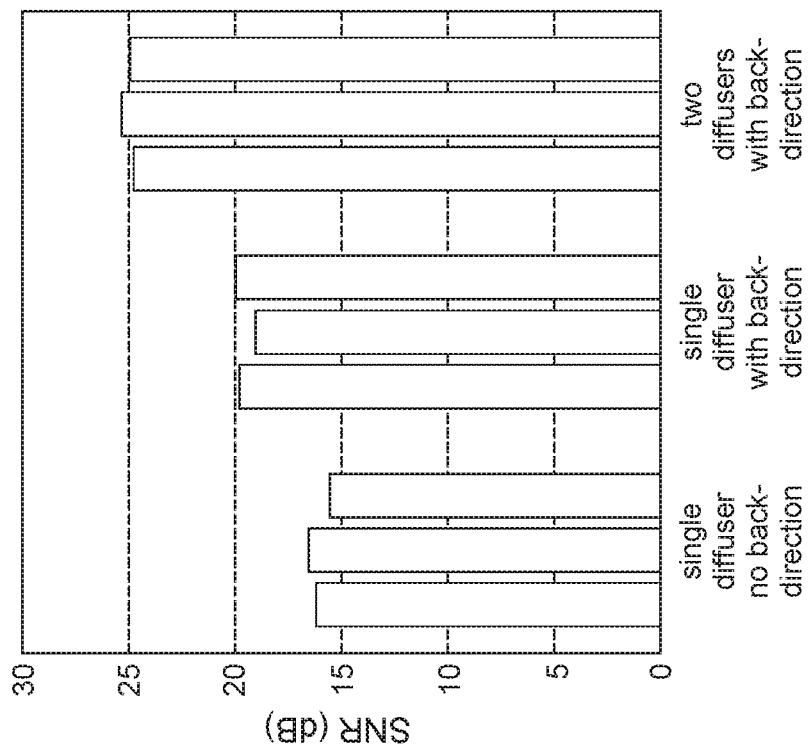

The optical output of an inventive illumination source appears to emanate from optical sources, both real and virtual, that occupy an area of the second optical diffuser 200 that is much larger than the area of the first optical diffuser 100 that is illuminated by the optical sources 90 (by more than a factor of 16 in the inventive example of FIGS. 9A, 9C, and 9D). The term "virtual sources" refer to the apparent points of origin of the various forward-directed beams of the optical signals 30 in the output of the inventive illuminator, where those apparent points of origin do not coincide with actual locations of the optical sources 90, i.e., the "real sources" or "actual sources." When an optical signal 10 or 20 is incident on more than one lens, prism, or grating of any array, the multiple resulting beams of the optical signals 20 or 30, respectively, appear to emanate from virtual sources at multiple different locations that differ from the locations of the optical sources 90. Using more highly divergent optical sources 90, a larger separation between the optical sources 90 and the first optical diffuser 100, or a larger separation between the first and second optical diffusers 100 and 200, can enable further increase of the effective size of the illumination source; such modifications shall fall within the scope of the present disclosure or appended claims.

Use of a first optical diffuser 100 having an angular field of illumination that is significantly larger than the divergence of the optical sources 90 enables illumination of a given area of the second optical diffuser 200 using a reduced overall distance between the optical sources 90 and the second diffuser 200. Reduction of that distance is desirable for reducing overall size of an inventive illumination source; arranging the first optical diffuser 100 to exhibit an increased or practicably maximal angular field of illumination enables reduction or practicable minimization of the distance between the optical sources 90 and the second optical diffuser 200 for a given desired illuminated area of the second optical diffuser 200. In various example embodiments, the diffuser substrate 100, the optical diffuser 200, or the optical sources 90 can be positioned or arranged to increase the effective area of the illumination source, relative to the area occupied by the array of optical sources 90, by more than a factor of 2, by more than a factor of 5, by more than a factor of 10, by more than a factor of 15, by more than a factor of 20, by more than a factor of 25, by more than a factor of 35, by more than a factor of 50, by more than a factor of 100, or even more.

The speckle-reduction effect is even more pronounced if the optical path differences (i) from each optical source 90 to corresponding illuminated positions on the second topical diffuser 200, or (ii) from different positions within the illuminated area of the second optical diffuser 200 to an illumination target, or both of those distances combined, exceed the coherence length of the input optical signals 10 produced by the optical sources 90. Once that threshold is crossed, different positions within the illuminated area of the second optical diffuser behave like mutually incoherent virtual optical sources, further reducing speckle. That speckle-reduction effect can be further enhanced by arranging one or both of the first or second optical diffusers 100 or 200 to redirect or transform portions of the input or first forward-directed optical signals 10 or 20, respectively, to form first or second backward-directed optical signals. One or more of the source substrate 95, the first diffuser substrate 105, the first optical diffuser 100, or the second diffuser substrate 205 are arranged so as to redirect or transform the corresponding backward-directed signals into additional input or first-forward-directed signals 10 or 20, respectively. That arrangement results in additional virtual optical sources, in additional to the real optical sources 90. If the round trip between the first optical diffuser 100 and the optical sources 90, or between the first and second optical diffusers 100 and 200, exceeds the coherence length of the input optical signals 10, then those additional virtual optical sources are mutually incoherent with the real optical sources 90 and virtual optical sources arising from forward direction of optical signals 20 and 30 by the optical diffuser 100 and 200, thus further reducing speckle. A detailed description of that back-directed arrangement is disclosed in U.S. provisional App. No. 62/922,214 filed Jul. 27, 2019 and U.S. non-provisional application Ser. No. 16/558,033 filed Aug. 30, 2019, both filed in the names of Greiner et al, both entitled "Optical apparatus for wide-angle illumination", and referred to herein as the "back-direction" applications); both of said applications are hereby incorporated by reference as if fully set forth herein.

Further speckle reduction can be achieved in some examples by arranging one or both of the first or second optical diffusers 100 or 200 so as to alter the polarization state among the forward-directed optical signals 300. Optical signals in different polarization states give rise to corresponding speckle patterns that differ, so that multiple different signals in multiple different polarizations states would tend to wash out, as described above. To produce forward-directed optical signals 30 with varying polarization states, one or both optical diffusers 100 or 200 can include, e.g., a spatially patterned birefringent material, a spatially patterned metamaterial, or other suitable one or more structures or materials that alter the polarization state of the forward-directed optical signals 30.

Another advantageous effect is that the optical output of the inventive optical apparatus can exhibit an angular field-of-illumination (FOI) that is larger than, or otherwise modified relative to, an angular FOI exhibited by the reference apparatus. In some various examples, the optical output exhibits an angular FOI that is greater than or about equal to 45° by 60°, greater than or about equal to 80° by 100°, greater than or about equal to 85° by 110°, greater than or about equal to 90° by 120°, or greater than or about equal to 120° by 140°. The first and second optical diffusers 100 and 200 can be suitably arranged so that overall optical transmissivity (defined herein as total optical power transmitted within the specified FOI by the second optical diffuser 200 divided by the total optical power incident on the first optical diffuser 100) is greater than about 30%, greater than about 50%, greater than about 70%, greater than about 80%, greater than about 90%, greater than about 95%, or even larger. In some examples the first optical diffuser 100 produces optical signals 20 that span the desired angular FOI, and the second optical diffuser 200 does not further increase the angular FOI of the optical signals 30, but does provide speckle reduction (as described above) or additional suppression of twice-forward-transmitted optical signals 32 (described below). In some examples the first optical diffuser 100 produces optical signals 20 that span only a fraction of the desired angular FOI, and the second optical diffuser 200 further increases the angular FOI of the optical signals 30 to achieve the desired angular FOI and also provides speckle reduction or suppression of twice-forward-transmitted optical signals 32. Such a two-step increase of the angular FOI can be advantageous, e.g., in examples wherein relative efficiency of the optical diffusers 100 and 200 decreases with increasing angles of redirection. In some examples, the first optical diffuser is arranged so as to provide the full angular FOI in only one dimension, and the second optical diffuser is arranged so as to provide the full angular FOI in the other dimension.

In a manner similar to conventional optical diffusers, the one or more optical sources (whether attached or separate) and the optical diffusers 100 and 200 are positioned and arranged so that the optical output exhibits a desired collective spatial profile of illumination intensity. A common profile that is employed is approximated by $1/\cos^N(\theta)$ (at least for angles $\theta$ greater than about 10° and within the FOI; in some examples for all angles within the FOI) where N is an integer; in many examples N=4 or N=7. The angle $\theta$ is measured from a propagation direction of the one or more twice-forward-transmitted optical signals 32 produced by the one or more optical sources without redirection or transformation by either of the optical diffusers 100 or 200. Whatever the desired illumination spatial profile, it has been observed that the presence of twice-forward-transmitted optical signals 32 can distort that profile, particularly at relatively small angles θ (because all of the optical sources 90, which can number in the hundreds or even thousands in a typical VCSEL array, all contribute corresponding undesirable twice-forward-transmitted optical signals 32 to the output that propagate in the same direction with the same divergence, whereas the desirable forward-directed optical signals 30 are dispersed over a larger angular field-of-illumination). However, the presence of two optical diffusers 100 and 200 in series (or more than two if needed or desired) correspondingly reduces the fraction of the input optical signals 10 that are transmitted as twice- (or thrice- or more-) transmitted optical signals 32, and thereby can result in enhanced suppression, relative to the reference apparatus, of a relative contribution by those twice-forward-transmitted optical signals 32 to the collective spatial profile of illumination intensity. In some examples the use of two or more optical diffusers can result in deviations from the desired illumination intensity profile (e.g., $1/\cos^4(\theta)$ or $1/\cos^7(\theta)$ or other desired profile), within the desired FOI, that are less than about ±10.%, less than about ±8%, less than about ±5%, less than about ±2.5%, or even smaller. Use of two optical diffusers 100 and 200 also enables in some examples greater control over the final collective spatial profile of illumination intensity, because there are two sets of elements (e.g., lenses, prisms, gratings, and so forth) that can be independently optimized to achieve the desired illumination pattern, or to maximize or minimize illumination intensity over a desired angular range.

The degree of the improvements described above that result from the use of two or more optical diffusers in series can in some examples depend on the spacing between the first and second optical diffusers 100 and 200, or the spacing between the optical sources 90 and the first optical diffuser 100. Some ranges for those spacings were given above. It may be desirable in some instances to perform at least a partial optimization of those spacings, monitoring improvement (or lack thereof) of one or more of the performance characteristics described above as a function of those spacings. The graph of FIG. 9D shows a speckle signal-to-noise ratio that increases with increasing separation between the first and second optical diffusers 100 and 200 (for the same specific example that generated the data presented in FIGS. 9A-9C).

The improvements noted above (e.g., reduced speckle, larger effective extended source, improved angular FOI, improved illumination pattern, and so forth) have been observed to be further enhanced by arranging the input or intermediate lateral surfaces 155 or 255 as described above. Redirecting optical signals to an optical diffuser that would otherwise have missed further increases the number of virtual sources that appear to be present.

Figure 2B:
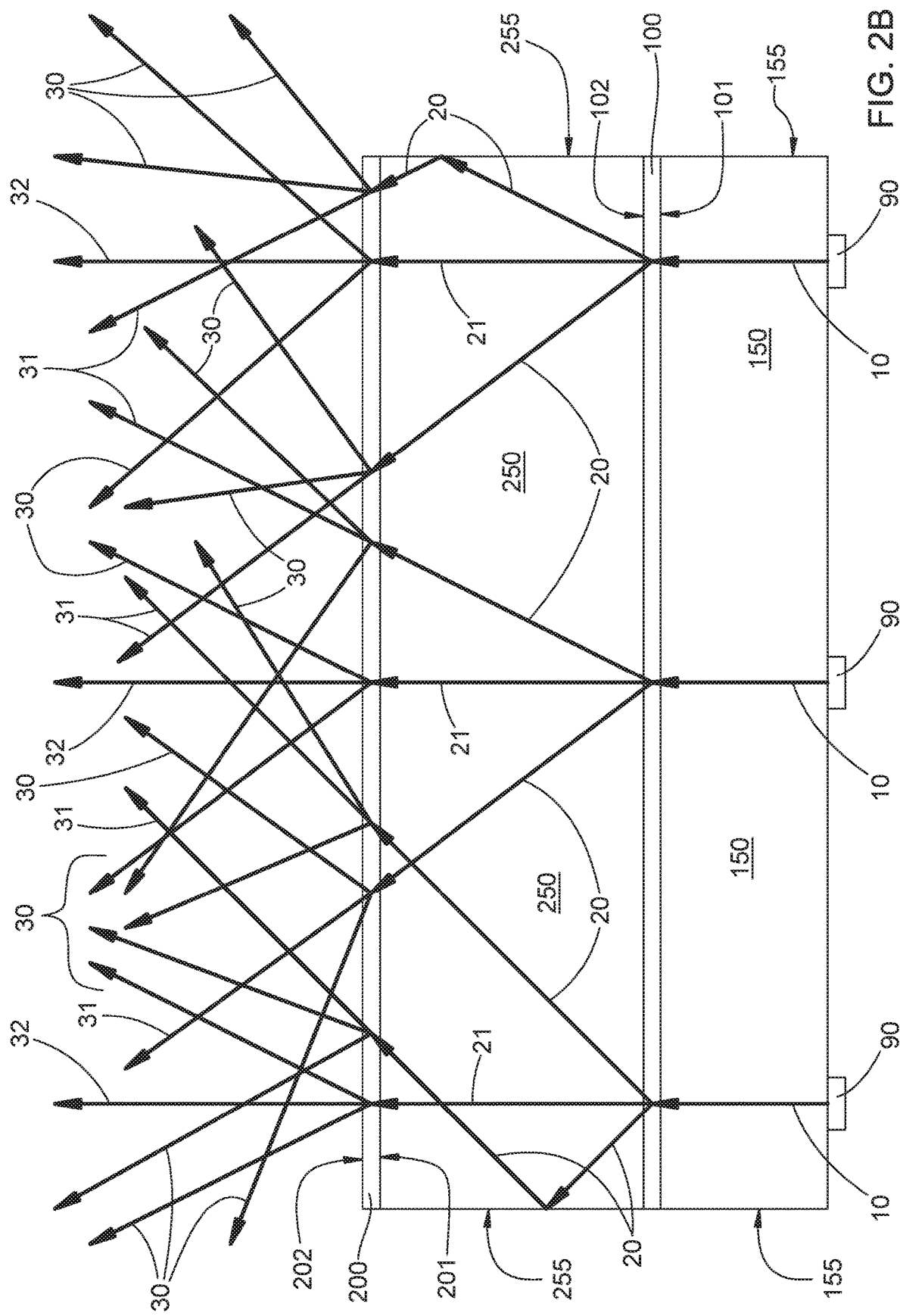
Figure 4F:
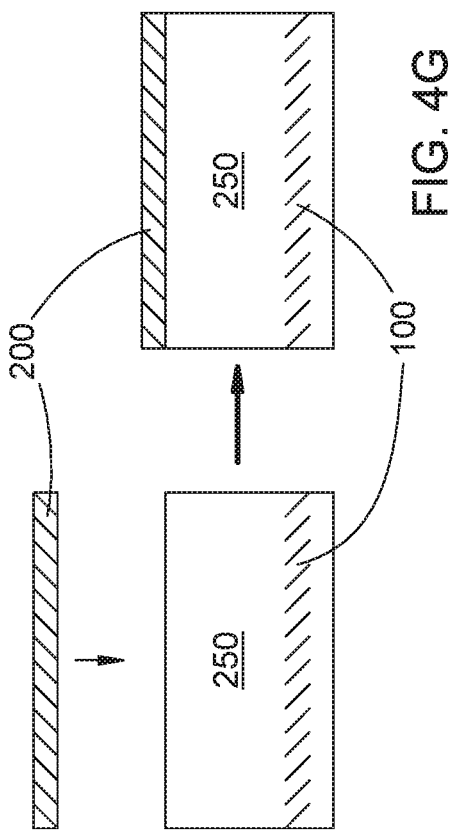
Figure 4G:
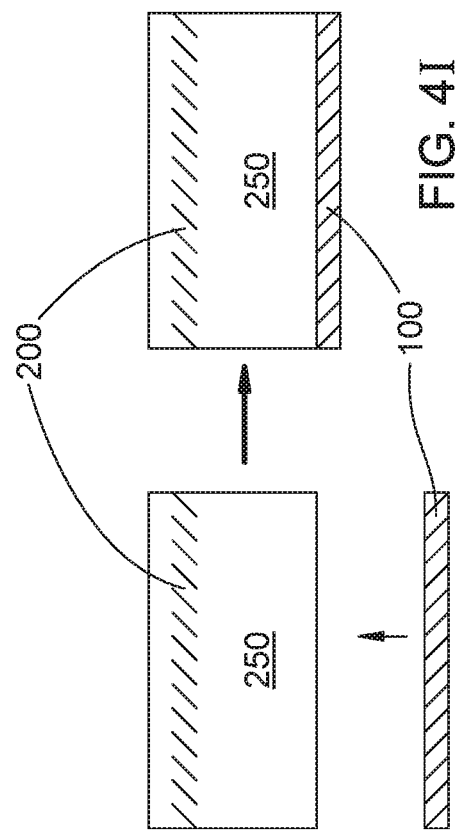
Figure 4H:
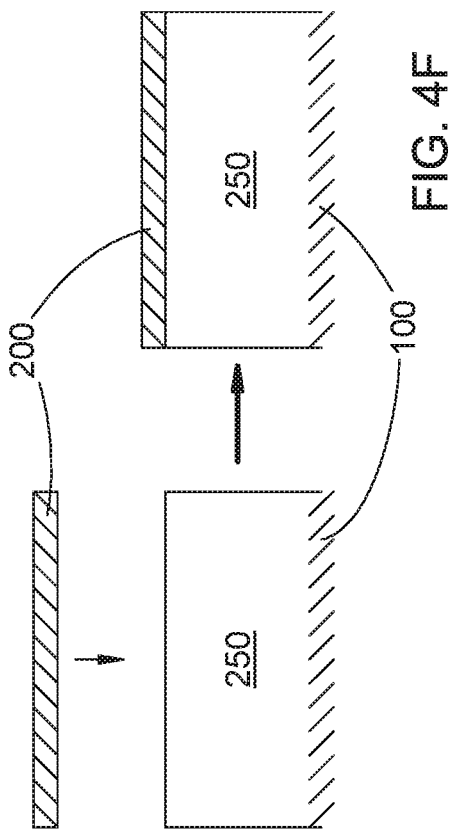
Figure 4I:
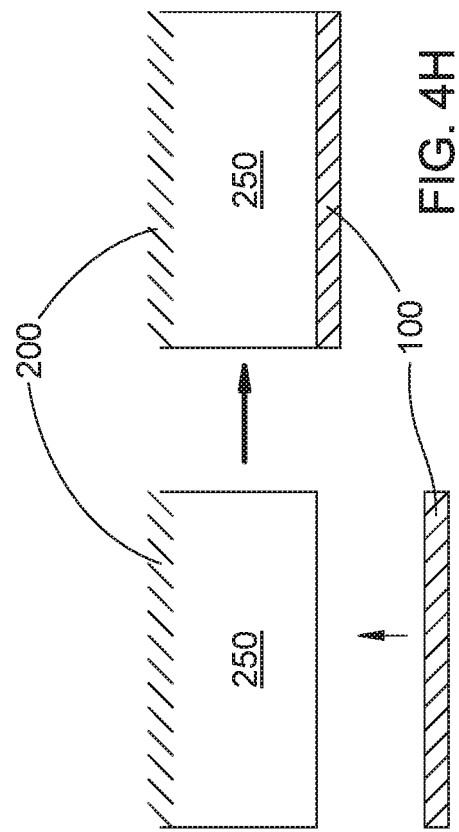

A particular example embodiment can be arranged generally according to FIGS. 2A and 2B in which the optical sources 90 comprise an array of VCSELs formed on the source substrate 95. A first reflector is formed on a front surface of the source substrate 95, a set of one or more gain layers and one or more confinement layers is formed on the first reflector, and a second reflector is formed on the set of gain and confinement layers. The VCSELs that form the optical sources 90 are defined by the first reflector, the gain and confinement layers, and the second reflector 98 The first reflector serves as the output coupling mirror for each VCSEL, the output of which propagates within the source substrate 95 as an input optical signal 10 that exits the back surface of the source substrate 95 (so-called back-emitting VCSELs). The first optical diffuser 100 is positioned against the back surface of the source substrate 95 in this example. If any first back-directed optical signals are produced by the first optical diffuser 100 or at the surface of the source substrate 95, they are in turn redirected or transformed at least partly by a single specular reflection by the first reflector; in some of those examples, a portion of the back-directed optical signals propagates through the VCSEL layers and can in some instances be amplified and reflected by the second reflector. In some examples, the first and second reflectors are each multilayer structures arranged as DBRs. In some examples, the one or more gain layers include one or more quantum well layers; in some examples, the one or more confinement layers include one or more oxide layers that each include a conductive aperture corresponding to each one of the one or more VCSELs.

The following interpretations shall apply for purposes of the present disclosure and appended claims. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open ended terminology, with the same meaning as if a phrase such as "at least" were appended after each instance thereof, unless explicitly stated otherwise.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. An optical apparatus comprising (i) a first optical diffuser having corresponding opposite input and output faces and (ii) a second optical diffuser having corresponding opposite input and output faces, wherein each one of the first and second optical diffusers is operational over a selected operational wavelength range, and wherein one or both of the first or second optical diffusers are arranged or positioned so that:

(a) the input face of second optical diffuser faces the output face of the first optical diffuser;

(b) at least a portion of each one of one or more forward-propagating input optical signals, each having a corresponding input signal wavelength within the operational wavelength range, each propagating toward and incident on the input face of the first optical diffuser, is redirected or transformed by the first optical diffuser into a corresponding first forward-directed optical signal that propagates between the first and second optical diffusers away from the output face of the first optical diffuser;
(c) at least a portion of each first forward-directed optical signal incident on the input face of the second optical diffuser is redirected or transformed by the second optical diffuser into a corresponding second forward-directed optical signal that propagates away from the output face of the second optical diffuser;
(d) as a result of the redirection or transformation of part (b), each first forward-directed optical signal differs from the corresponding input optical signal with respect to one or more of (i) a number of corresponding constituent optical beams, (ii) propagation direction of one or more of the corresponding constituent optical beams, or (iii) angular divergence of one or more of the corresponding constituent optical beams;
(e) as a result of the redirection or transformation of part (c), each second forward-directed optical signal differs from the corresponding first forward-directed optical signal with respect to one or more of (i) a number of corresponding constituent optical beams, (ii) propagation direction of one or more of the corresponding constituent optical beams, or (iii) angular divergence of one or more of the corresponding constituent optical beams; and
(f) the corresponding second forward-directed optical signals, arising from all first forward-directed optical signals incident on the input face of the second optical diffuser, collectively comprise optical output of the optical apparatus;
wherein the first optical diffuser is spaced apart from the second optical diffuser, and each first forward-directed optical signal incident on the input face of the second optical diffuser propagates through a solid intermediate optical medium between the output face of the first optical diffuser and the input face of the second optical diffuser.

2. The apparatus of claim 1 wherein (i) the first optical diffuser includes a diffuse scatter, and one or more of the first forward-directed optical signals are formed at least partly by diffuse scattering, by the first optical diffuser, of portions of the corresponding input optical signals, or (ii) the second optical diffuser includes a diffuse scatter, and one or more of the second forward-directed optical signals are formed at least partly by diffuse scattering, by the second optical diffuser, of portions of the corresponding first forward-directed optical signals.

3. The apparatus of claim 1 wherein (i) the first optical diffuser includes an array of refractive or diffractive lenses or refractive or diffractive prisms, and one or more of the first forward-directed optical signals are formed at least partly by refraction or reflection, by the first optical diffuser, of portions of the corresponding input optical signals, or (ii) the second optical diffuser includes an array of refractive or diffractive lenses or refractive or diffractive prisms, and one or more of the second forward-directed optical signals are formed at least partly by refraction or reflection, by the second optical diffuser, of portions of the corresponding first forward-directed optical signals.

4. An optical apparatus comprising (i) a first optical diffuser having corresponding opposite input and output faces and (ii) a second optical diffuser having corresponding opposite input and output faces, wherein one or both of the first or second optical diffusers are arranged or positioned so that:
(a) the input face of second optical diffuser faces the output face of the first optical diffuser;
(b) at least a portion of each one of one or more forward-propagating input optical signals, each having a corresponding input signal wavelength within an operational wavelength range, each propagating toward and incident on the input face of the first optical diffuser, is redirected or transformed by the first optical diffuser into a corresponding first forward-directed optical signal that propagates between the first and second optical diffusers away from the output face of the first optical diffuser;
(c) at least a portion of each first forward-directed optical signal incident on the input face of the second optical diffuser is redirected or transformed by the second optical diffuser into a corresponding second forward-directed optical signal that propagates away from the output face of the second optical diffuser;
(d) as a result of the redirection or transformation of part (b), each first forward-directed optical signal differs from the corresponding input optical signal with respect to one or more of (i) a number of corresponding constituent optical beams, (ii) propagation direction of one or more of the corresponding constituent optical beams, or (iii) angular divergence of one or more of the corresponding constituent optical beams;
(e) as a result of the redirection or transformation of part (c), each second forward-directed optical signal differs from the corresponding first forward-directed optical signal with respect to one or more of (i) a number of corresponding constituent optical beams, (ii) propagation direction of one or more of the corresponding constituent optical beams, or (iii) angular divergence of one or more of the corresponding constituent optical beams; and
(f) the corresponding second forward-directed optical signals, arising from all first forward-directed optical signals incident on the input face of the second optical diffuser, collectively comprise optical output of the optical apparatus;
wherein the output face of the first optical diffuser and input face of the second optical diffuser are spaced apart by more than about 0.20 mm.

5. An optical apparatus comprising (i) a first optical diffuser having corresponding opposite input and output faces and (ii) a second optical diffuser having corresponding opposite input and output faces, wherein one or both of the first or second optical diffusers are arranged or positioned so that:
(a) the input face of second optical diffuser faces the output face of the first optical diffuser;
(b) at least a portion of each one of one or more forward-propagating input optical signals, each having a corresponding input signal wavelength within an operational wavelength range, each propagating toward and incident on the input face of the first optical diffuser, is redirected or transformed by the first optical diffuser into a corresponding first forward-directed optical signal that propagates between the first and second optical diffusers away from the output face of the first optical diffuser;
(c) at least a portion of each first forward-directed optical signal incident on the input face of the second optical diffuser is redirected or transformed by the second optical diffuser into a corresponding second forward-directed optical signal that propagates away from the output face of the second optical diffuser;

(d) as a result of the redirection or transformation of part (b), each first forward-directed optical signal differs from the corresponding input optical signal with respect to one or more of (i) a number of corresponding constituent optical beams, (ii) propagation direction of one or more of the corresponding constituent optical beams, or (iii) angular divergence of one or more of the corresponding constituent optical beams;

(e) as a result of the redirection or transformation of part (c), each second forward-directed optical signal differs from the corresponding first forward-directed optical signal with respect to one or more of (i) a number of corresponding constituent optical beams, (ii) propagation direction of one or more of the corresponding constituent optical beams, or (iii) angular divergence of one or more of the corresponding constituent optical beams; and (f) the corresponding second forward-directed optical signals, arising from all first forward-directed optical signals incident on the input face of the second optical diffuser, collectively comprise optical output of the optical apparatus; and one or more intermediate lateral surfaces positioned and arranged so as to at least partially encircle a volume between the first and second optical diffusers and reflect toward the input face of the second optical diffuser at least a portion of each first forward-directed optical signal that impinges upon one of the intermediate lateral surfaces.

6. An optical apparatus comprising (i) a first optical diffuser having corresponding opposite input and output faces and (ii) a second optical diffuser having corresponding opposite input and output faces, wherein one or both of the first or second optical diffusers are arranged or positioned so that:

(a) the input face of second optical diffuser faces the output face of the first optical diffuser;

(b) at least a portion of each one of one or more forward-propagating input optical signals, each having a corresponding input signal wavelength within an operational wavelength range, each propagating toward and incident on the input face of the first optical diffuser, is redirected or transformed by the first optical diffuser into a corresponding first forward-directed optical signal that propagates between the first and second optical diffusers away from the output face of the first optical diffuser;

(c) at least a portion of each first forward-directed optical signal incident on the input face of the second optical diffuser is redirected or transformed by the second optical diffuser into a corresponding second forward-directed optical signal that propagates away from the output face of the second optical diffuser;

(d) as a result of the redirection or transformation of part (b), each first forward-directed optical signal differs from the corresponding input optical signal with respect to one or more of (i) a number of corresponding constituent optical beams, (ii) propagation direction of one or more of the corresponding constituent optical beams, or (iii) angular divergence of one or more of the corresponding constituent optical beams;

(e) as a result of the redirection or transformation of part (c), each second forward-directed optical signal differs from the corresponding first forward-directed optical signal with respect to one or more of (i) a number of corresponding constituent optical beams, (ii) propagation direction of one or more of the corresponding constituent optical beams, or (iii) angular divergence of one or more of the corresponding constituent optical beams; and (f) the corresponding second forward-directed optical signals, arising from all first forward-directed optical signals incident on the input face of the second optical diffuser, collectively comprise optical output of the optical apparatus; and one or more optical sources that are each positioned and arranged so as to produce corresponding one or more of the one or more input optical signals, wherein the one or more optical sources includes one or more light-emitting diodes or one or more semiconductor lasers.

7. The apparatus of claim 6 wherein the operational wavelength range includes a span of wavelengths that are larger than about 0.20 μm and smaller than about 10 μm.

8. The apparatus of claim 6 wherein the one or more optical sources comprises a two-dimensional array of VCSELs.

9. The apparatus of claim 6 wherein each input optical signal incident on the input face of the first optical diffuser propagates through a solid input optical medium between the one or more optical sources and the input face of the first optical diffuser.

10. The apparatus of claim 9 further comprising a first reflector formed on the input optical medium, a set of one or more gain layers and one or more confinement layers formed on the first reflector, and a second reflector formed on the set of gain and confinement layers, wherein each one of the one or more optical sources comprises a VCSEL defined by the first reflector, the gain and confinement layers, and the second reflector.

11. The apparatus of claim 6 wherein each input optical signal incident on the input face of the first optical diffuser propagates between the one or more optical sources and the input face of the first optical diffuser through vacuum, through a liquid or gaseous ambient optical medium, or through a contained, liquid or gaseous input optical medium.

12. The apparatus of claim 6 wherein the one or more optical sources and the input face of the first optical diffuser are spaced apart by more than about 0.20 mm.

13. The apparatus of claim 6 further comprising one or more input lateral surfaces positioned and arranged so as to (i) at least partially encompass a volume between the one or more optical sources and the first optical diffuser and (ii) reflect toward the input face of the first optical diffuser at least a portion of each input optical signal that impinges upon one of the input lateral surfaces.

14. The apparatus of claim 6 wherein the one or more optical sources and the first and second optical diffusers are positioned and arranged so that the optical output exhibits an observed collective spatial profile of illumination intensity that deviates, within a specified angular field-of-illumination, from a specified collective spatial profile of illumination intensity by less than about ±10%, less than about ±8%, less than about ±5%, or less than about ±2.5%.

15. The apparatus of claim 14 wherein the specified collective spatial profile of illumination intensity is approximated by $1/\cos^N(\theta)$ for angles $\theta$ greater than about 10° and within the specified field-of-illumination, where N is an integer and the angle $\theta$ is measured from a propagation direction of the one or more input optical signals.

16. The apparatus of claim 6 wherein the first optical diffuser and the one or more optical sources are arranged or positioned so that: (i) a portion of each input optical signal is redirected or transformed by the first optical diffuser into a corresponding first backward-directed optical signal that propagates away from the input face of the first optical diffuser toward the one or more optical sources; and (ii) at least a portion of each first backward-directed optical signal is redirected or transformed into one or more corresponding additional forward-propagating input optical signals propagating toward the input face of the first optical diffuser.

17. An optical apparatus comprising (i) a first optical diffuser having corresponding opposite input and output faces and (ii) a second optical diffuser having corresponding opposite input and output faces, wherein one or both of the first or second optical diffusers are arranged or positioned so that:
    (a) the input face of second optical diffuser faces the output face of the first optical diffuser;
    (b) at least a portion of each one of one or more forward-propagating input optical signals, each having a corresponding input signal wavelength within an operational wavelength range, each propagating toward and incident on the input face of the first optical diffuser, is redirected or transformed by the first optical diffuser into a corresponding first forward-directed optical signal that propagates between the first and second optical diffusers away from the output face of the first optical diffuser;
    (c) at least a portion of each first forward-directed optical signal incident on the input face of the second optical diffuser is redirected or transformed by the second optical diffuser into a corresponding second forward-directed optical signal that propagates away from the output face of the second optical diffuser;
    (d) as a result of the redirection or transformation of part (b), each first forward-directed optical signal differs from the corresponding input optical signal with respect to one or more of (i) a number of corresponding constituent optical beams, (ii) propagation direction of one or more of the corresponding constituent optical beams, or (iii) angular divergence of one or more of the corresponding constituent optical beams;
    (e) as a result of the redirection or transformation of part (c), each second forward-directed optical signal differs from the corresponding first forward-directed optical signal with respect to one or more of (i) a number of corresponding constituent optical beams, (ii) propagation direction of one or more of the corresponding constituent optical beams, or (iii) angular divergence of one or more of the corresponding constituent optical beams; and
    (f) the corresponding second forward-directed optical signals, arising from all first forward-directed optical signals incident on the input face of the second optical diffuser, collectively comprise optical output of the optical apparatus;
    (g) a portion of each first forward-directed optical signal is redirected or transformed by the second optical diffuser into a corresponding second backward-directed optical signal that propagates away from the input face of the second optical diffuser toward the output face of the first optical diffuser; and
    (h) at least a portion of each second backward-directed optical signal is redirected or transformed by the first optical diffuser into one or more corresponding additional first forward-directed optical signals propagating toward the input face of the second optical diffuser.

18. An optical apparatus comprising (i) a first optical diffuser having corresponding opposite input and output faces and (ii) a second optical diffuser having corresponding opposite input and output faces, wherein one or both of the first or second optical diffusers are arranged or positioned so that:
    (a) the input face of second optical diffuser faces the output face of the first optical diffuser;
    (b) at least a portion of each one of one or more forward-propagating input optical signals, each having a corresponding input signal wavelength within an operational wavelength range, each propagating toward and incident on the input face of the first optical diffuser, is redirected or transformed by the first optical diffuser into a corresponding first forward-directed optical signal that propagates between the first and second optical diffusers away from the output face of the first optical diffuser;
    (c) at least a portion of each first forward-directed optical signal incident on the input face of the second optical diffuser is redirected or transformed by the second optical diffuser into a corresponding second forward-directed optical signal that propagates away from the output face of the second optical diffuser;
    (d) as a result of the redirection or transformation of part (b), each first forward-directed optical signal differs from the corresponding input optical signal with respect to one or more of (i) a number of corresponding constituent optical beams, (ii) propagation direction of one or more of the corresponding constituent optical beams, or (iii) angular divergence of one or more of the corresponding constituent optical beams;
    (e) as a result of the redirection or transformation of part (c), each second forward-directed optical signal differs from the corresponding first forward-directed optical signal with respect to one or more of (i) a number of corresponding constituent optical beams, (ii) propagation direction of one or more of the corresponding constituent optical beams, or (iii) angular divergence of one or more of the corresponding constituent optical beams; and
    (f) the corresponding second forward-directed optical signals, arising from all first forward-directed optical signals incident on the input face of the second optical diffuser, collectively comprise optical output of the optical apparatus;
    wherein the first optical diffuser includes an array of diffraction gratings, and one or more of the first forward-directed optical signals are formed at least partly by non-zero-order diffraction, by the first optical diffuser, of portions of the corresponding input optical signals, or the second optical diffuser includes an array of diffraction gratings, and one or more of the second forward-directed optical signals are formed at least partly by non-zero-order diffraction, by the second optical diffuser, of portions of the corresponding first forward-directed optical signals.

19. A method for making an optical apparatus, the method comprising positioning a first optical diffuser, having corresponding opposite input and output faces, and a second optical diffuser, having corresponding opposite input and output faces, with the input face of second optical diffuser faces the output face of the first optical diffuser, the first and second optical diffusers being thus positioned or arranged so that:
    (a) at least a portion of each one of one or more forward-propagating input optical signals, each having a corresponding input signal wavelength within an operational wavelength range, each propagating toward and incident on the input face of the first optical diffuser, is redirected or transformed by the first optical diffuser into a corresponding first forward-directed optical signal that propagates between the first and second optical diffusers away from the output face of the first optical diffuser;

(b) at least a portion of each first forward-directed optical signal incident on the input face of the second optical diffuser is redirected or transformed by the second optical diffuser into a corresponding second forward-directed optical signal that propagates away from the output face of the second optical diffuser;

(c) as a result of the redirection or transformation of part (a), each first forward-directed optical signal differs from the corresponding input optical signal with respect to one or more of (i) a number of corresponding constituent optical beams, (ii) propagation direction of one or more of the corresponding constituent optical beams, or (iii) angular divergence of one or more of the corresponding constituent optical beams;

(d) as a result of the redirection or transformation of part (b), each second forward-directed optical signal differs from the corresponding first forward-directed optical signal with respect to one or more of (i) a number of corresponding constituent optical beams, (ii) propagation direction of one or more of the corresponding constituent optical beams, or (iii) angular divergence of one or more of the corresponding constituent optical beams; and (e) the corresponding second forward-directed optical signals, arising from all first forward-directed optical signals incident on the input face of the second optical diffuser, collectively comprise optical output of the optical apparatus wherein the first optical diffuser is spaced apart from the second optical diffuser, and each first forward-directed optical signal incident on the input face of the second optical diffuser propagates through a solid intermediate optical medium between the output face of the first optical diffuser and the input face of the second optical diffuser.

20. The method of claim 19 further comprising positioning and arranging one or more optical sources relative to the first and second optical diffusers so as to produce corresponding one or more of the one or more input optical signals.

* * * * *